United States Patent
Tanada

(10) Patent No.: US 7,268,499 B2
(45) Date of Patent: Sep. 11, 2007

(54) SELF LIGHT EMITTING DEVICE AND METHOD OF DRIVING THEREOF

(75) Inventor: Yoshifumi Tanada, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 45 days.

(21) Appl. No.: 11/140,735

(22) Filed: Jun. 1, 2005

(65) Prior Publication Data

US 2005/0218820 A1    Oct. 6, 2005

Related U.S. Application Data

(60) Continuation of application No. 10/909,514, filed on Aug. 3, 2004, now Pat. No. 6,903,516, which is a division of application No. 09/956,298, filed on Sep. 18, 2001, now Pat. No. 6,774,578.

(30) Foreign Application Priority Data

Sep. 19, 2000    (JP)    ............................. 2000-283584

(51) Int. Cl.
  G09G 3/10    (2006.01)
  G09G 3/30    (2006.01)
(52) U.S. Cl. .................... 315/169.3; 345/76
(58) Field of Classification Search ........... 315/169.1, 315/169.2, 169.3, 169.4; 345/70, 76
  See application file for complete search history.

(56) References Cited

U.S. PATENT DOCUMENTS

| | | |
|---|---|---|
| 4,581,655 A | 4/1986 | Ide et al. |
| 5,508,759 A | 4/1996 | Konishi et al. .......... 351/206 |
| 5,625,415 A | 4/1997 | Ueno et al. .............. 348/350 |
| 5,659,328 A | 8/1997 | Todokoro et al. |

(Continued)

FOREIGN PATENT DOCUMENTS

EP    0 661 726    7/1995

(Continued)

OTHER PUBLICATIONS

Shimoda.T et al., "Current Status And Future Of Light-Emitting Polymer Display Driven By Poly-Si TFT," SID Digest '99: SID International Symposium Digest Of Technical Papers, May 18, 1999, pp. 372-375.

(Continued)

*Primary Examiner*—Shih-Chao Chen
*Assistant Examiner*—Minh Dieu A
(74) *Attorney, Agent, or Firm*—Fish & Richardson P.C.

(57) ABSTRACT

A self light emitting device having a function of correcting drops in brightness in self light emitting elements in a pixel portion, and capable of displaying a uniform image without brightness irregularities, is provided. A specific test pattern is displayed when an electric power source is connected, brightnesses are detected by photoelectric conversion elements arranged in each pixel, and then stored in a memory circuit. A correction circuit then corrects a first image signal based on portions which are insufficient from standard brightnesses (brightnesses of normal self light emitting elements at the same gray stale, stored in advance), and a second image signal is obtained. Display of an image in a display device is performed in accordance with the second image signal.

20 Claims, 18 Drawing Sheets

U.S. PATENT DOCUMENTS

| | | | |
|---|---|---|---|
| 5,714,968 A | 2/1998 | Ikeda | |
| 5,940,053 A | 8/1999 | Ikeda | |
| 5,945,972 A | 8/1999 | Okumura et al. | 345/98 |
| 6,008,910 A | 12/1999 | Ikeda et al. | 358/487 |
| 6,011,529 A * | 1/2000 | Ikeda | 345/77 |
| 6,023,257 A | 2/2000 | Koyama | 345/58 |
| 6,069,674 A * | 5/2000 | Aomori et al. | 349/12 |
| 6,144,366 A | 11/2000 | Numazaki et al. | 345/156 |
| 6,249,362 B1 | 6/2001 | Sato et al. | 358/527 |
| 6,303,963 B1 | 10/2001 | Ohtani et al. | 257/350 |
| 6,333,962 B1 | 12/2001 | Kitaguchi et al. | 257/350 |
| 6,335,716 B1 | 1/2002 | Yamazaki et al. | 345/92 |
| 6,388,652 B1 | 5/2002 | Yamazaki et al. | 345/98 |
| 6,473,065 B1 | 10/2002 | Fan | 345/82 |
| 6,518,962 B2 * | 2/2003 | Kimura et al. | 345/211 |
| 6,774,578 B2 * | 8/2004 | Tanada | 315/169.4 |
| 6,903,516 B2 * | 6/2005 | Tanada | 315/169.4 |
| 2002/0033783 A1 | 3/2002 | Koyama | 345/82 |
| 2002/0180721 A1 | 12/2002 | Kimura et al. | |
| 2003/0063081 A1 | 4/2003 | Kimura et al. | |

FOREIGN PATENT DOCUMENTS

| | | |
|---|---|---|
| EP | 0 923 067 | 6/1999 |
| JP | 59-181880 | 10/1984 |
| JP | 08-054836 | 2/1996 |
| JP | 08-160883 | 6/1996 |
| JP | 09-043627 | 2/1997 |
| JP | 11-109918 | 4/1999 |
| JP | 11-160729 | 6/1999 |
| JP | 11-282420 | 10/1999 |
| JP | 2000-227608 | 8/2000 |
| WO | WO98/40871 | 9/1998 |

OTHER PUBLICATIONS

Han.C et al., "3.8 Green OLED With Low Temperature Poly Si TFT," Eurodisplay '99: Proceedings Of The 19th IDRC (International Display Research Conference)Late-News Papers, Sep. 6, 1999, pp. 27-30.

Shimoda.T et al., "High Resolution Light Emitting Polymer Display Driven By Low Temperature Polysilicon Thin Film Transistor With Integrated Driver," Asia Display '98: Proceedings Of The 18th IDRC (International Display Research Conference), 1998, pp. 217-220.

Tsutsui et al., "Electroluminescence in Organic Thin Films." *Photochemical Processes in Organized Molecular Systems* (1991): pp. 437-450.

Baldo et al., "Highly Efficient Phosphorescent Emission from Organic Electroluminescent Devices." *Nature* 395 (1998): pp. 151-154.

Baldo et al., "Very High-Efficiency Green Organic Light-Emitting Devices Based on Electrophosphorescence." *Applied Physics Letters* 75(1): pp. 4-6, no date.

Tsutsui et al., "High Quantum Efficiency in Organic Light-Emitting Devices with Iridium-Complex as a Triplet Emissive Center." *Japanese Journal of Applied Physics* 38(12B): pp. L1502-L1504, no date.

* cited by examiner

Correction Amount of Pixel 201 : (A−B$_1$) / X = 0

Correction Amount of Pixel 202: (A−B$_2$) / X = 1

Correction Amount of Pixel 203: (A−B$_3$) / X = 2

Correction Amount of Pixel 301: $(C-B_1)/X = -2$

Correction Amount of Pixel 302: $(C-B_2)/X = -1$

Correction Amount of Pixel 303: $(C-B_3)/X = 0$ $V_{EL2} = V_{EL1} + \delta$

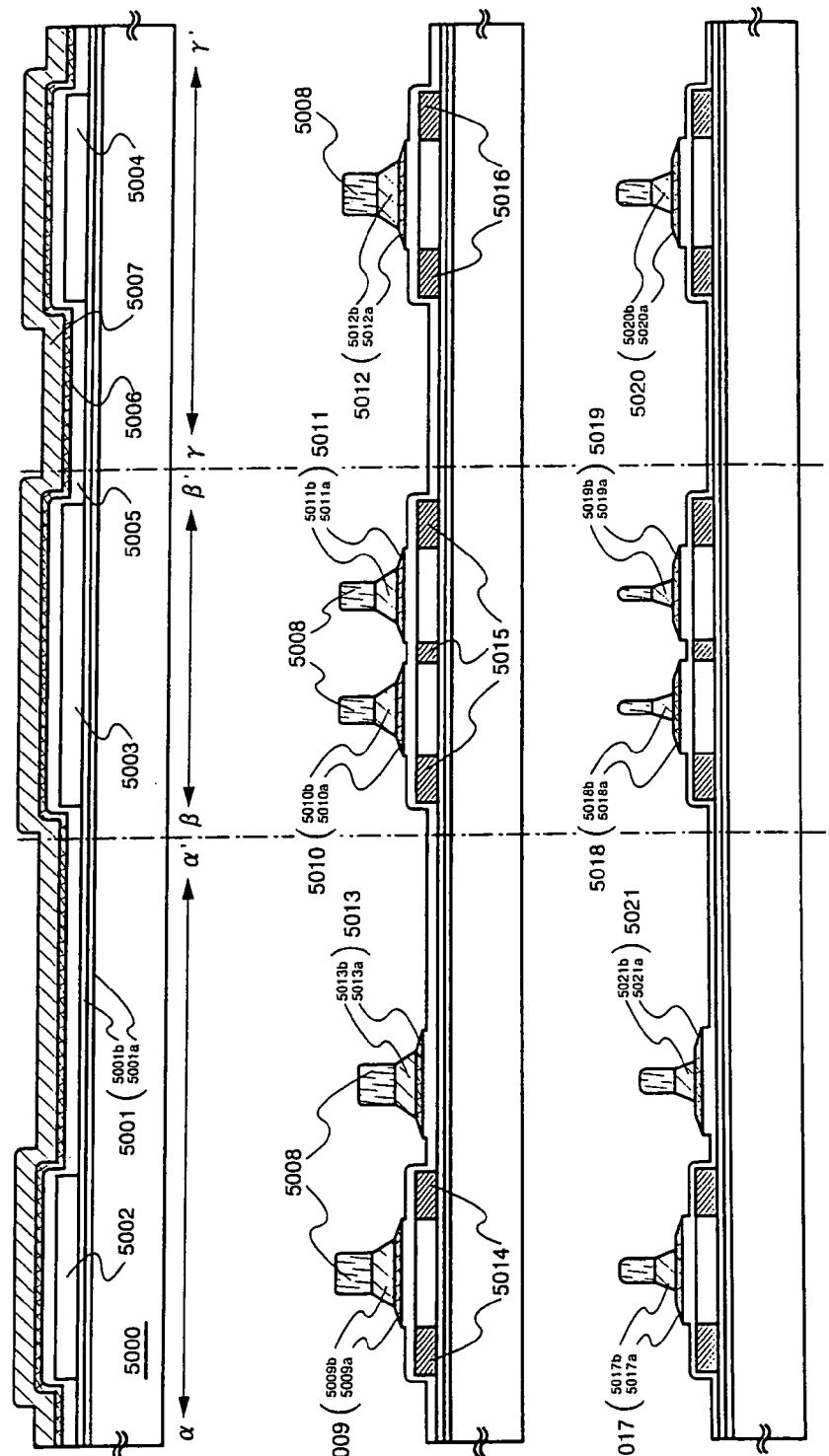

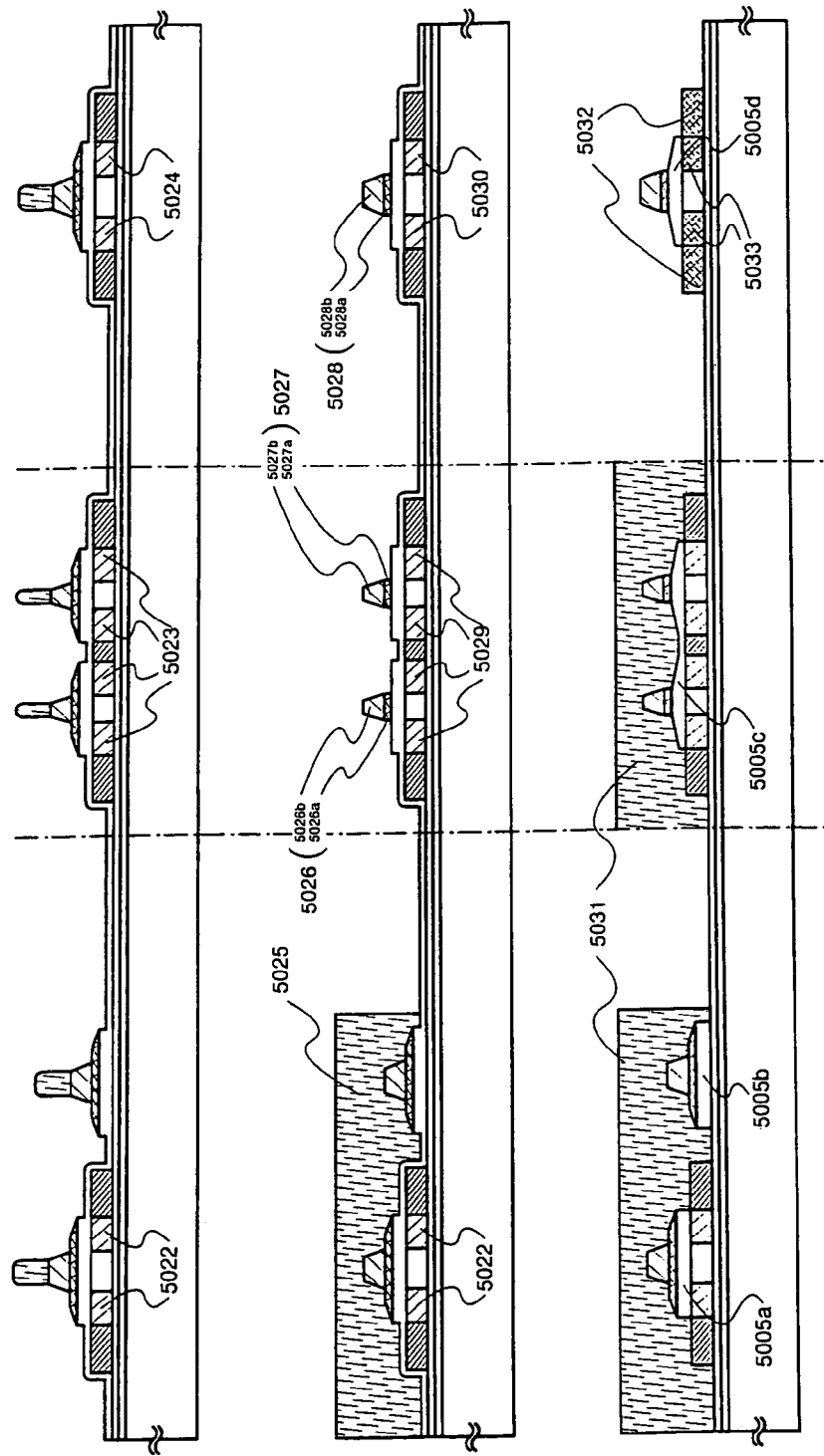

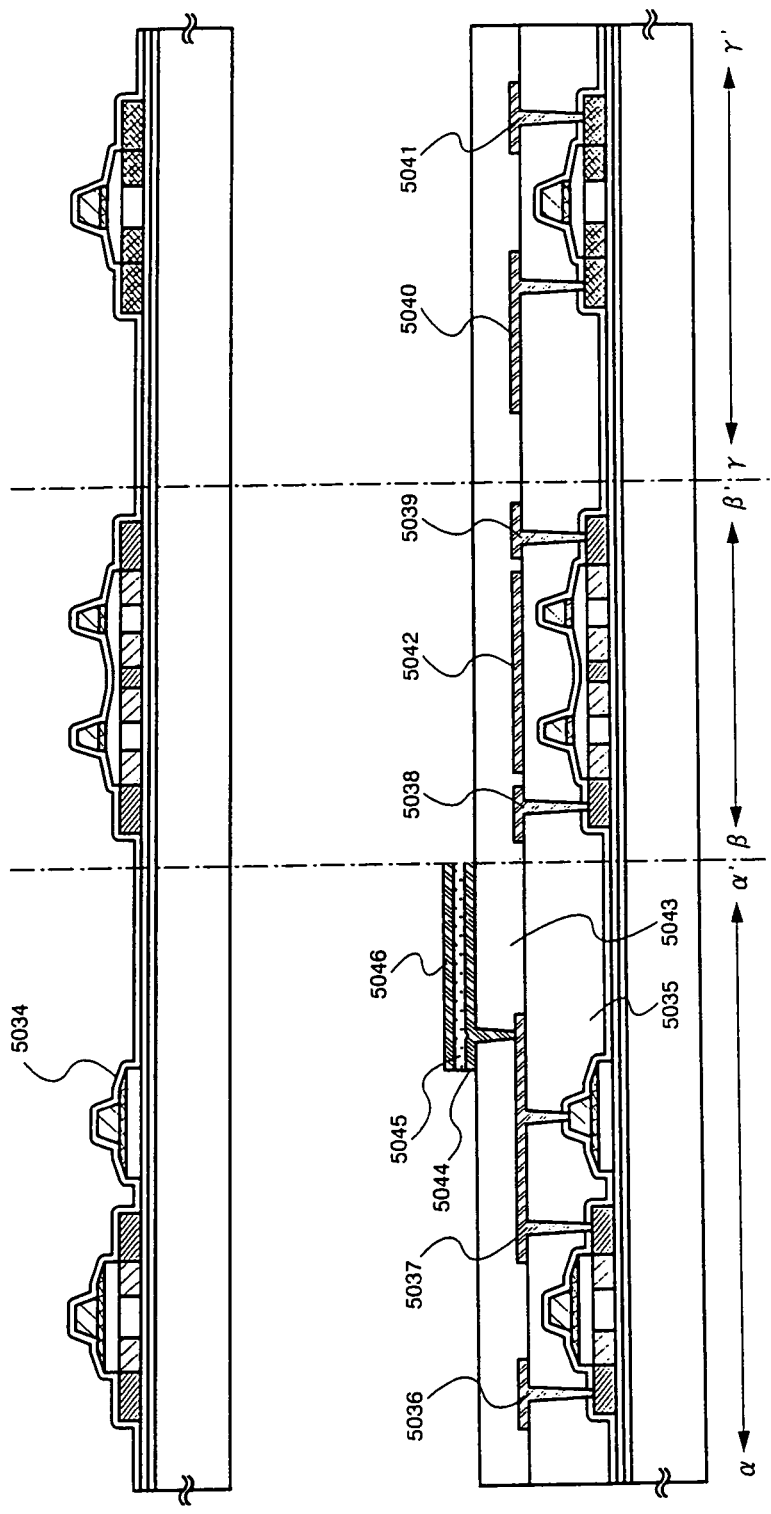

Static image is displayed.

Black image is displayed.
(Light-emitting element : off-state)

White image is displayed.
(Light-emitting element : on-state)

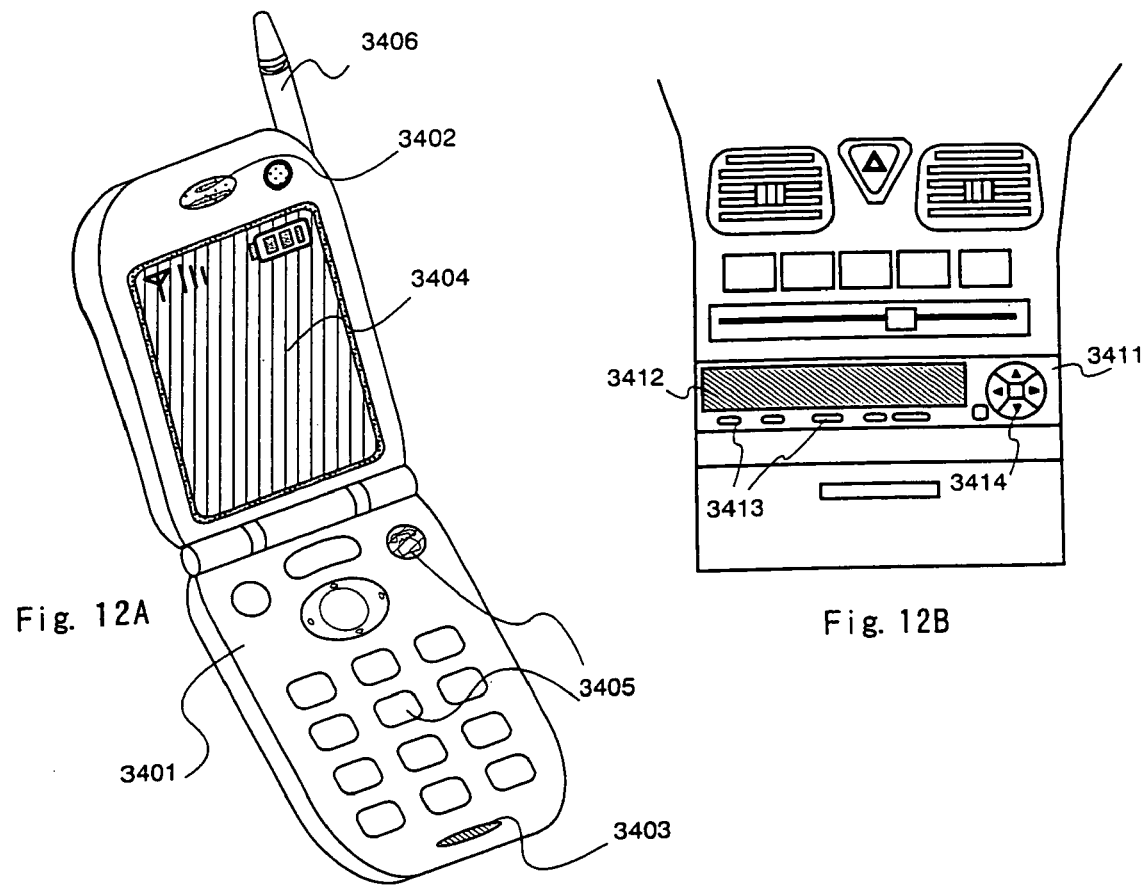
Fig. 12A
Fig. 12B
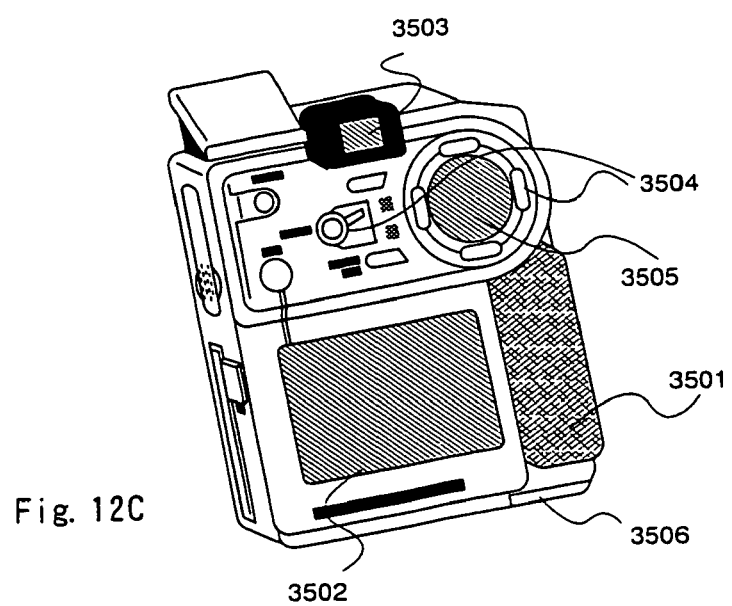
Fig. 12C

SELF LIGHT EMITTING DEVICE AND METHOD OF DRIVING THEREOF

CROSS-REFERENCE TO RELATED APPLICATIONS

This application is a continuation application U.S. application Ser. No. 10/909,514, filed Aug. 3, 2004, now a U.S. Pat. No. 6,903,576, which is a divisional application of U.S. application Ser. No. 09/956,298, filed Sep. 18, 2001, now U.S. Pat. No. 6,774,578, which claims the benefit of a foreign priority application filed in Japan on Sep. 19, 2000, as Application No. 2000-283584. This application claims priority to each of these prior applications, and the disclosures of the prior applications are considered part of (and are incorporated by reference in) the disclosure of this application.

BACKGROUND OF THE INVENTION

1. Field of the Invention

The present invention relates to a self light emitting device, and more particularly, to an active matrix self light emitting device. Among such devices, in particular, the present invention relates to an active matrix self light emitting device using self light emitting elements, such as organic electroluminescence (EL) elements, in a pixel portion.

2. Description of the Related Art

The spread of self light emitting devices in which a semiconductor thin film is formed on an insulator such as a glass substrate, in particular to active matrix self light emitting devices using thin film transistors (hereafter referred to as TFTs), has been remarkable recently. Active matrix self light emitting devices have from several hundred thousand to several million TFTs formed in a matrix shape in a pixel portion, and display of an image is performed by controlling the electric charge of each of the pixels.

In addition, techniques relating to polysilicon TFTs used for simultaneously forming driver circuits using TFTs formed in the periphery of the pixel portion, in addition to pixel TFTs structuring the pixels, have been developed recently, and these contribute greatly to the miniaturization of devices, and also to reducing the electric power consumption of the devices. Self light emitting devices have thus become indispensable devices in display portions of mobile devices having a remarkably wide range of applications in recent years.

Further, self light emitting devices which apply self light emitting materials such as organic EL materials as flat displays in substitute for LCDs (liquid crystal displays) are under the spotlight, and are being enthusiastically researched.

A schematic diagram of a normal self light emitting device is shown in FIG. 15A. The use of an organic EL element (hereafter referred to simply as an EL element) as one example of a self light emitting element is explained in this specification. A pixel portion 1504 is arranged in the center of an insulating substrate (such as glass, for example) 1501. In addition to source signal lines and gate signal lines, electric current supply lines 1505 for supplying electric current to EL elements are arranged in the pixel portion 1504. A source signal line driver circuit 1502 for controlling the source signal lines is arranged on the top side of the pixel portion 1504, and gate signal line driver circuits 1503 are placed on the left and the right of the pixel portion 1504 in order to control the gate signal lines. Note that although the gate signal line driver circuits 1503 are arranged on both the left and right sides of the pixel portion in FIG. 15A, they may also both be placed on the same side. However, from the perspectives of drive efficiency and reliability, it is preferable to arrange the gate signal lines on both sides. Input of signals from the outside into the source signal line driver circuit 1502 and the gate signal line driver circuits 1503 is performed via a flexible printed circuit (FPC) 1506.

An expanded view of a portion surrounded by a dotted line frame 1500 within FIG. 15A is shown in FIG. 15B. The pixel portion has pixels arranged in a matrix shape, as shown in the figure. A portion additionally surrounded by a dotted line frame 1510 within FIG. 15B is one pixel, and the pixel has a source signal line 1511, a gate signal line 1512, an electric current supply line 1513, a switching TFT 1514, an EL driver TFT 1515, a storage capacitor 1516, and an EL element 1517.

Operation of active matrix self light emitting devices is explained next while referring to the same FIG. 15B. First, a voltage is applied to the gate electrode of the switching TFT 1514 when the gate signal line 1512 is selected, and the switching TFT 1514 is placed in a conductive state. The signal (voltage signal) of the source signal line 1511 is stored as an electric charge in the storage capacitor 1516 by doing so. A voltage $V_{GS}$ between a gate and a source of the EL driver TFT 1515 is determined by the electric charge accumulated in the storage capacitor 1516, and an electric current corresponding to the voltage of the storage capacitor 1516 flows in the EL driver TFT 1515 and in the EL element 1517. The EL element 1517 turns on as a result.

The brightness of the EL element 1517, equal to the amount of electric current flowing in the EL element 1517, can be controlled in accordance with $V_{GS}$ of the EL driver TFT 1515. $V_{GS}$ is the voltage of the storage capacitor 1516, and that is the signal (voltage) input to the source signal line 1511. In other words, the brightness of the EL element 1517 is controlled by controlling the signal (voltage) input to the source signal line 1511. Finally, the gate signal line 1512 is placed in an unselected state, the gate of the switching TFT 1514 is closed, and the switching TFT 1514 is placed in an unselected state. The electric charge which has accumulated in the storage capacitor 1516 is maintained at this point. $V_{GS}$ of the EL driver TFT 1515 is therefore maintained as is, and the amount of electric current corresponding to $V_{GS}$ continues to flow in the EL element 1517 via the EL driver TFT 1515.

Information regarding EL element drive is reported upon in papers such as the following: Current Status and Future of Light Emitting Polymer Display Driven by Poly-Si TFT, SID99 Digest, p. 372; High Resolution Light Emitting Polymer Display Driven by Low Temperature Polysilicon Thin Film Transistor with Integrated Driver, ASIA DISPLAY 98, p. 217; and 3.8 Green OLED with Low Temperature Poly-Si TFT, Euro Display 99 Late News, p. 27.

A method of gray scale display in the EL element 1517 is discussed next. An analog gray scale method for controlling the brightness of the EL elements 1517 by the voltage $V_{GS}$ between the gate and the source of the EL driver TFT 1515 has a disadvantage in that it is weak with respect to dispersion in the electric current characteristics of the EL driver TFTs 1515. That is, if the electric current characteristics of the EL driver TFTs 1515 differ, then the value of the electric current flowing in the EL driver TFTs 1515 and the EL elements 1517 changes even if the same gate voltages are applied. As a result, the brightnesses of the EL elements 1517, namely the gray scales, also change.

A method referred to as a digital gray scale method has therefore been proposed in order to reduce the influence of dispersion in the characteristics of the EL driver TFTs 1515 and obtain a uniform screen picture. This method is a method for controlling the gray scale by two states, a state in which the absolute value $|V_{GS}|$ between a gate and a source of the EL driver TFT 1515 is below the turn on start voltage (in which almost no electric current flows), and a state in which the absolute value $|V_{GS}|$ is greater than the brightness saturation voltage (in which an electric current close to the maximum flows). In this case, the value of the electric current becomes close to $I_{MAX}$ even if there are dispersions in the electric current characteristics of the EL driver TFTs 1515, provided that the absolute values $|V_{GS}|$ of the EL driver TFFs 1515 are sufficiently larger than the brightness saturation voltage. The influence of EL driver TFT dispersions can therefore be made extremely small. The gray scales are thus controlled by two states, an ON state (bright state due to maximum electric current flow) and an OFF state (dark state due to no electric current flow). This method is therefore referred to as a digital gray scale method.

However, only two gray scales can be displayed with the digital gray scale method. A plurality of techniques which can achieve multiple gray scales, in which another method is combined with the digital gray scale method, have been proposed.

A time gray scale method is one method which can be used to achieve multiple gray scales. The time gray scale method is a method in which the time during which the EL elements 1517 are turned on is controlled, and gray scales are output by the length of the turn on time. In other words, one frame period is divided into a plurality of subframe periods, and gray scales are realized by controlling the number and the length of the subframe periods during which turn on is performed.

Refer to FIGS. 9A and 9B. Simple timing charts for a time gray scale method are shown in FIGS. 9A and 9B. An example of obtaining 3-bit gray scales by a time gray scale method with the frame frequency set to 60 Hz is shown.

As shown in FIG. 9A, one frame period is divided into a number of subframe periods corresponding to the number of gray scale bits. Three bits are used here, and therefore one frame period is divided into three subframe periods $SF_1$ to $SF_3$. One subframe period is further divided into an address period ($Ta_\#$) and a sustain (turn on) period ($Ts_\#$). (See FIG. 20B.) A sustain period during a subframe period denoted by reference symbol $SF_1$ is referred to as $Ts_1$. Similarly, sustain periods for the cases of subframes $SF_2$ and $SF_3$ are referred to as $Ts_2$ and $Ts_3$, respectively. Address periods $Ta_1$ to $Ta_3$ are each periods during which one frame portion of an image signal is written into the pixels, and their lengths are therefore equal in all of the subframe periods. The sustain periods have lengths proportional to powers of 2, and the sustain periods here are such that $Ts_1:Ts_2:Ts_3=2^2:2^1:2^0=4:2:1$.

As a gray scale display method, the brightness is controlled by the sum of all the sustain (turn on) periods within one frame period in accordance with controlling which subframe periods the EL elements are turned on, and which subframe periods the EL elements are not turned on, in the sustain (turn on) periods from $Ts_1$ to $Ts_3$. In this example, $2^3=8$ turn on time lengths can be set by combining the sustain (turn on) periods, and therefore 8 gray scales from 0 (all black display) to 7 (all white display) can be displayed, as shown in FIG. 9B. Gray scales are thus expressed by utilizing the length of the turn on time. Similar gray scale expression is also possible, of course, in a color display self light emitting device.

In addition, the number of divisions within one frame period may also be increased for a case of increased gray scales. The proportional lengths of the sustain (turn on) periods for a case of dividing one frame period into n subframe periods become $Ts_1:Ts_2:\ldots:Ts_{(n-1)}:Ts_n=2^{(n-1)}:2^{(n-2)}:\ldots:2^1:2^0$, and it becomes possible to express $2^n$ gray scales. Note that the appearance of the subframe periods may be in random order from $SF_1$ to SFn. Note also that gray scale expression is possible even if the lengths of the sustain (turn on) periods are not made into powers of two.

Problem points relating to self light emitting devices using self light emitting elements such as EL elements are discussed. As stated above, electric current is always supplied during the periods in which the EL elements are turned on, and the electric current flows within the EL elements. The nature of the EL elements degrades due to being turned on for a long time, and the brightness characteristics change with this as a cause. That is, even if the same electric current at the same voltage is supplied from the same electric current supply source, a difference develops between the brightness of EL elements which have degraded and EL elements which have not degraded.

A specific example is explained. FIG. 10A is a display screen of a device using a self light emitting device, such as a portable information terminal and icons for operation and the like 1001 are displayed. The proportion of time during which there is static display like that shown in FIG. 10A is normally large with this type of portable information device. If icons and the like are displayed by a color (gray scale) which is brighter than the background, then the EL elements in the pixels of portions which display the icons and the like are turned on for a longer time that the EL elements of portions displaying the background, and degradation proceeds very quickly.

The EL elements are assumed to have been degraded by these conditions. Display examples of the self light emitting device after degradation are shown in FIGS. 10B and 10C. First, for a case of black display such as that shown in FIG. 10B, the self light emitting elements such as EL elements are in a state in which a voltage is not applied, namely the EL elements express black by not turning on, and therefore the degradation is not a problem for black display. However, for a case of white display, even if the same electric current is supplied to the EL elements which have been degraded due to long turn on time (EL elements of portions displaying icons and the like in this case), there is insufficient brightness and irregularities develop as shown by reference numeral 1011 in FIG. 10C.

There is a method in which the voltage applied to the degraded EL elements is raised in order to eliminate the brightness irregularities, but the electric current supply line in a self light emitting device is normally structured by a single wiring. Further, it is not easy to structure a circuit for changing the voltage applied to the EL element in one specific pixel within the pixels arranged in a matrix shape of a pixel portion. In addition, there is dispersion of the EL driver TFTs, as stated above, and this correction method cannot be said to be preferable.

There is a technique recorded in Japanese Patent Application Serial No. 2000-273139 as a method of solving the above problem points. A simple explanation of this technique is made using FIG. 18.

FIG. 18 is a schematic diagram of a device in a self light emitting device having a degradation correction function recorded in Japanese Patent Application Serial No. 2000-273139. In accordance with this method, the turn on time of each pixel, or the turn on time and the turn on strength, is detected by periodically sampling a first image signal 1801A using a counter 1802 and stored in memories 1803 and 1804. The sum of the detected values, and the hourly change data of the brightness characteristics of the EL elements already stored in a correction data storage portion 1806 are referenced, the image signal for driving the pixels having degraded EL elements is corrected by computations in a correction circuit 1805, and a second image signal 1801B is obtained. Image display is performed using the second image signal 1801B. The brightness irregularities in the display device 1807 having degraded EL elements in a portion of the pixels are thus corrected, and a uniform screen picture is obtained.

However, the degradation state of the EL elements at a certain point is not directly detected with the method stated above, and the degradation state is merely estimated from the total turn on time of the elements, or from the total turn on time and turn on strength. The term turn on strength used here is not the turn on strength of the EL elements themselves, but is obtained from reading the gray scale of the input digital image signal. There is a disadvantage in that the correction of the image signal is performed in accordance with correction data prepared in advance; in other words, degradation not due to driving time cannot be dealt with. For example, reductions in brightness developing from degradation due to temperature changes or the like cannot be coped with by the count of only the total turn on time. There also cannot be a response to brightness defects due to dispersion in the initial properties of the elements themselves with this method.

SUMMARY OF THE INVENTION

An object of the present invention is to provide a self light emitting device capable of long term uniform screen display with no brightness irregularities, in which a degradation state is detected by a method which does not depend on EL element degradation, and used to correct an image signal.

Means such as those below are used in the present invention in order to solve the above problems.

Pixels have EL elements and photoelectric conversion elements in a self light emitting device of the present invention having a brightness correction function, and the brightnesses of the EL elements during display at a certain gray scale are detected by photoelectric conversion elements placed in each pixel. Subsequently, the insufficient brightness portions are computed by comparing the values detected by the photoelectric conversion elements with standard brightnesses for the EL elements at the same gray scale which are stored in advance. After correction is performed on the gray scale data of the image signal by a correction circuit, it is input to a display device. The display device performs display of an image using the image signal after the correction. Uniform display, in which brightness irregularities do not develop, can be maintained by the above method even in a self light emitting device having EL elements which develop brightness defects.

Structures of self light emitting devices of the present invention are recorded below.

According to a first aspect of the present invention, a self light emitting device for displaying an image, into which an image signal is input, is characterized by comprising:

means for detecting the brightnesses of self light emitting elements of each pixel;

means for storing the brightnesses; and means for correcting the image signal based on the stored brightnesses;

wherein:

an image is displayed using the corrected image signal.

According to a second aspect of the present invention, a self light emitting device for displaying an image, into which an image signal is input, is characterized by comprising:

a brightness correction device having:

photoelectric conversion elements for detecting the brightnesses of self light emitting elements of pixels;

a memory circuit for storing the brightnesses of the self light emitting elements of each of the pixels, detected by the photoelectric conversion elements; and a signal correction portion for correcting a first image signal according to the brightnesses of the self light emitting elements of each pixel stored in the memory, and outputting a second image signal; and a display device for performing display of an image based on the second image signal.

According to a third aspect of the present invention, a self light emitting device for displaying an image, into which an image signal is input, is characterized by comprising:

a brightness correction device having:

j×k (where j and k are natural numbers) photoelectric conversion elements for detecting the brightnesses of self light emitting elements of each pixel;

a memory circuit for storing the brightnesses of the self light emitting elements of each of the pixels, detected by the photoelectric conversion elements; and a signal correction portion for correcting a first image signal according to the brightnesses of the self light emitting elements of each pixel stored in the memory, and outputting a second image signal; and a display device having j×k pixels for performing display of an image based on the second image signal.

According to a fourth first aspect of the present invention, a self light emitting device according to any one of claims 1 to 3 is characterized in that:

the self light emitting device performs display of n bit (where n is a natural number, n≧2) gray scales and has a driver circuit for performing n+m bit (where m is a natural number) signal processing; and equal brightnesses are obtained between self light emitting elements which do not develop a reduction in brightness, and self light emitting elements which do develop a reduction in brightness, by:

performing display of gray scales in accordance with an n bit image signal in the pixels having light emitting elements which do not develop a reduction in brightness, and performing correction of the image signal by using an m bit signal against the n bit image signal in the pixels in which do develop a reduction in brightness.

According to a fifth aspect of the present invention, in the self light emitting device according to any one of the first to third aspects of the invention, the device is characterized in that the correction means performs relative addition processing on image signals written into the pixels of the self light emitting elements which develop a reduction in brightness, with respect to image signals written into the pixels of the self light emitting elements which do not develop a reduction in brightness.

According to a sixth aspect of the present invention, in the self light emitting device according to any one of the first to third aspects of the invention, the device is characterized in that the correction means performs relative subtraction processing on image signals written into the pixels of the self light emitting elements which develop a small reduction in brightness, or on image signals written into the pixels of the self light emitting elements which do not develop a reduction in brightness, with respect to image signals written into the pixels of the self light emitting elements which develop a large reduction in brightness.

According to a seventh aspect of the present invention, in the self light emitting device according to any of the first to sixth aspects of the invention, the device is characterized in that the storage means uses a static memory circuit (SRAM).

According to an eighth aspect of the present invention, in the self light emitting device according to any of the first to sixth aspect of the invention, the device is characterized in that the storage means uses a dynamic memory circuit (DRAM).

According to a ninth aspect of the present invention, in the self light emitting device according to any of the first to sixth aspect of the invention, the device is characterized in that the storage means uses a ferroelectric memory circuit (FeRAM).

According to a tenth aspect of the present invention, in the self light emitting device according to any of the first to sixth aspects of the invention, the device is characterized in that the storage means uses a non-volatile memory (EEPROM) capable of being electrically written into, read out form, and erased.

According to an eleventh aspect of the present invention, tin he self light emitting device according to any one of the first to tenth aspects of the invention, the device is characterized in that PN photodiodes are used in the photoelectric conversion elements as the brightness detection means.

According to a twelfth aspect of the present invention, in the self light emitting device according to any one of the first to tenth aspects of the invention, the device is characterized in that PIN photodiodes are used in the photoelectric conversion elements as the brightness detection means.

According to a thirteenth aspect of the present invention, in the self light emitting device according to any one of the first to tenth aspects of the invention, the device is characterized in that avalanche photodiodes are used in the photoelectric conversion elements as the brightness detection means.

According to a fourteenth aspect of the present invention, in the self light emitting device according to any one of the first to thirteenth aspects of the invention, the device is characterized in that the detection means, the storage means, and the correction means are structured by circuits external to the self light emitting device.

According to a fifteenth aspect of the present invention, in the self light emitting device according to any one of the first to thirteenth aspects of the invention, the device is characterized in that the detection means, the storage means, and the correction means are formed on a same insulator as the self light emitting device.

According to a sixteenth aspect of the present invention, in the self light emitting device according to any one of the first to fifteenth aspects of the invention, the device is characterized in that the self light emitting device is an EL display.

According to a seventeenth aspect of the present invention, in the self light emitting device according to any one of the first to fifteenth aspects of the invention, the device is characterized in that the self light emitting device is a PDP display.

According to an eighteenth aspect of the present invention, in the self light emitting device according to any one of the first to fifteenth aspects of the invention, the device is characterized in that the self light emitting device is an FED display.

According to a nineteenth aspect of the present invention, a method of driving a self light emitting device for displaying an image, into which an image signal is input, is characterized by:

detecting the brightnesses of self light emitting elements of each pixel;

storing the detected brightnesses of the self light emitting elements of each of the pixels;

performing correction according to the difference between the stored brightnesses of the self light emitting elements of each of the pixels, and standard brightnesses, and outputting a second image signal; and performing display of an image using the second image signal.

According to a twentieth aspect of the present invention, a method of driving a self light emitting device for displaying an image, into which an image signal is input, is characterized by:

detecting the brightnesses of self light emitting elements of each pixel by using photoelectric conversion elements;

storing the brightnesses of the self light emitting elements of each of the pixels detected by the photoelectric conversion elements, in a memory circuit;

performing correction of a first image signal in a signal correction portion according to the difference between the brightnesses of the self light emitting elements of each of the pixels stored in the memory circuit and standard brightnesses, and outputting a second image signal; and performing display of an image using the second image signal.

According to a twenty-first aspect of the present invention, in the method of driving a self light emitting device according to the nineteenth or twentieth aspect of the invention, the method is characterized in that:

the self light emitting device performs display of n bit (where n is a natural number, $n \geq 2$) gray scales and has a driver circuit for performing n+m bit (where m is a natural number) signal processing; and equal brightnesses are obtained between self light emitting elements which do not develop a reduction in brightness, and self light emitting elements which do develop a reduction in brightness, by:

performing display of gray scales in accordance with an n bit image signal in the pixels having self light emitting elements which do not develop a reduction in brightness, and performing correction of the image signal by using an m bit signal against the n bit image signal in the pixels having self light emitting elements which do develop a reduction in brightness.

According to a twenty-second aspect of the present invention, in the method of driving a self light emitting device according to any one of the nineteenth to twenty-first aspects of the invention, the method is characterized in that the correction means performs relative addition processing on image signals written into the pixels of the self light emitting elements which develop a reduction in brightness, with respect to image signals written into the pixels of the self light emitting elements which do not develop a reduction in brightness.

According to a twenty-third aspect of the present invention, in the method of driving a self light emitting device according to any one of the nineteenth to twenty-first aspects of the invention, the method is characterized in that the correction means performs relative subtraction processing on image signals written into the pixels of the self light emitting elements which develop a small reduction in brightness, or on image signals written into the pixels of the self light emitting elements which do not develop a reduction in brightness, with respect to image signals written into the pixels of the self light emitting elements which develop a large reduction in brightness.

BRIEF DESCRIPTION OF THE DRAWINGS

In the accompanying drawings:

FIGS. 5A to 5C are diagrams showing an example of a process of producing an active matrix self light emitting device;

FIGS. 6A to 6C are diagrams showing the example of a process of producing an active matrix self light emitting device;

FIGS. 7A and 7B are diagrams showing the example of a process of producing an active matrix self light emitting device;

FIGS. 12A to 12C are diagrams showing examples of applications of the self light emitting device of the present invention having brightness detection and correction functions to electronic equipment;

DETAILED DESCRIPTION OF THE PREFERRED EMBODIMENTS

Embodiment Mode

Figure 1:
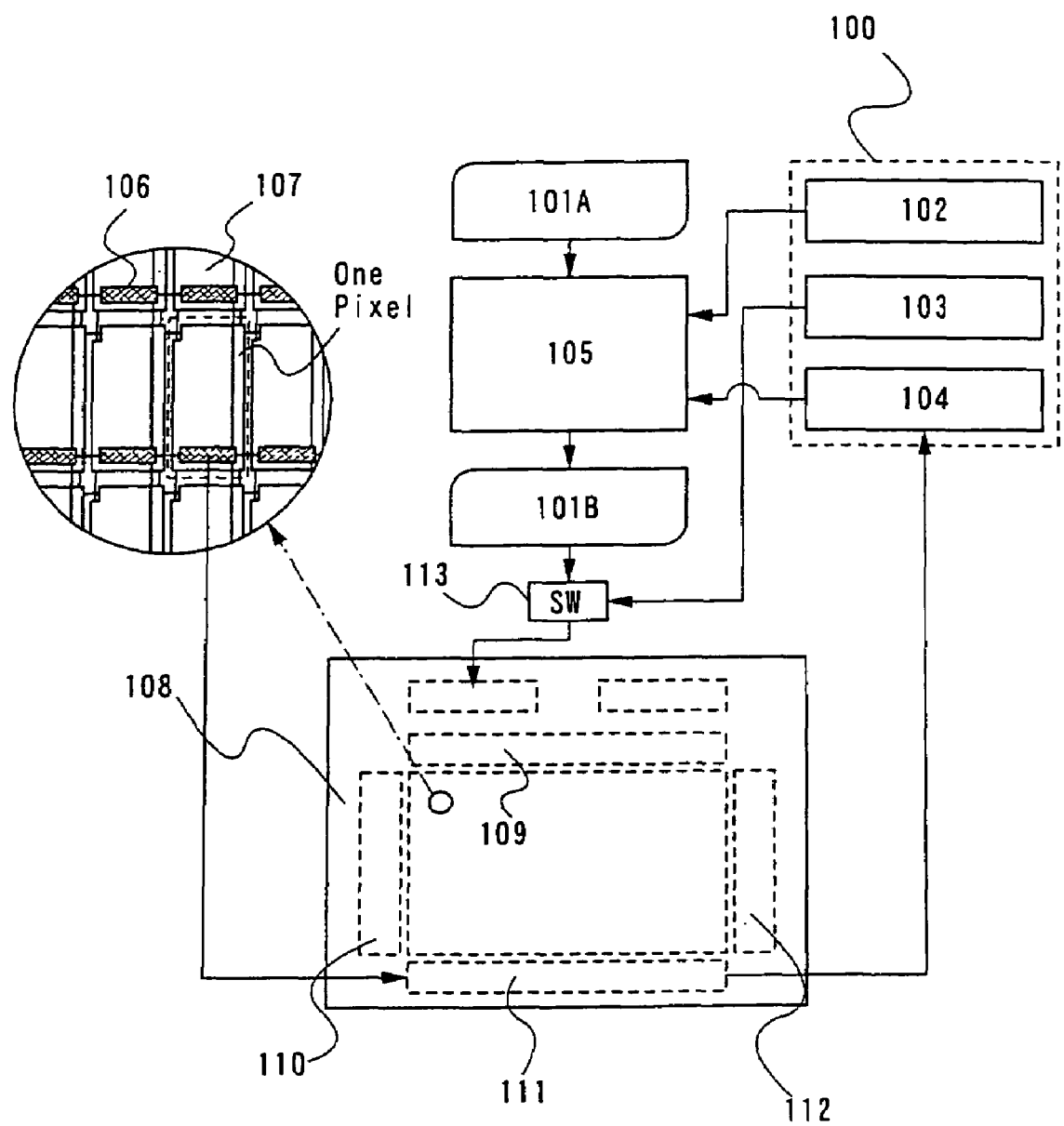
FIG. 1 is a block diagram of a self light emitting device of the present invention having brightness detection and correction functions.

Refer to FIG. 1. FIG. 1 shows a block diagram of a self light emitting device of the present invention having a brightness correction function. A brightness correction device, the mainstay of the present invention, is composed of a memory circuit portion 100, a correction circuit 105, and photoelectric conversion elements 106. The memory circuit portion 100 houses a correction data storage portion 102 a test pattern 103 and the like and has a memory circuit 104 for storing detected brightnesses. The photoelectric conversion elements 106 are arranged so that they overlap with a portion of the self light emitting elements 107. The light emitting surface of the self light emitting elements 107 is compressed if the size of the photoelectric conversion elements 106 is large, and it is therefore preferable to make the photoelectric conversion elements 106 as small as possible. An amplified voltage is obtained through an amplifier circuit, such as an operational amplifier, for signals resulting after photoelectric conversion of light irradiated from the self light emitting elements 107 because the signals are weak.

Figure 14A:
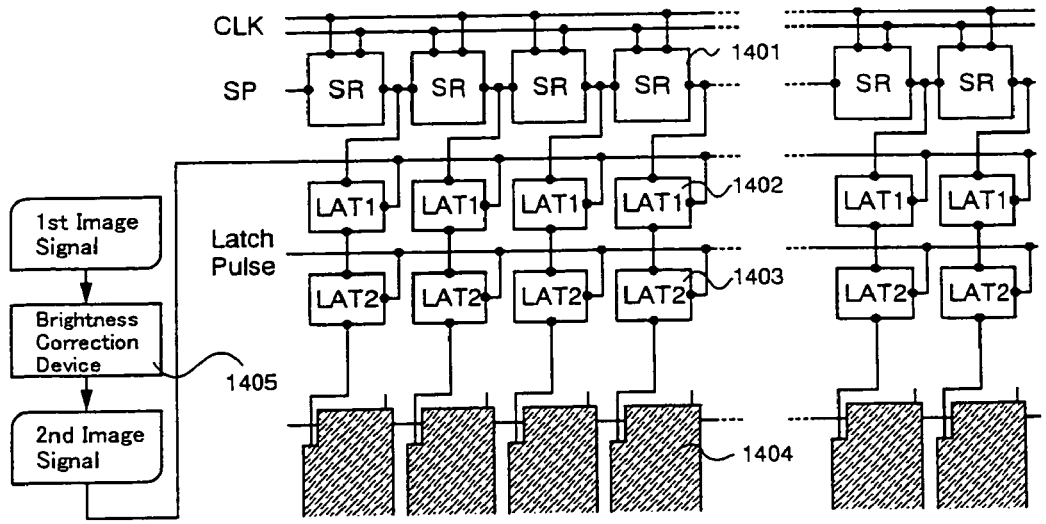
FIGS. 14A and 14B are block diagrams of source signal line driver circuits of a digital image signal input method and an analog signal input method, respectively, in a self light emitting device of the present invention having brightness detection and correction functions.

A circuit diagram of a source signal line driver circuit in a display device 108 is shown in FIG. 14A. Here, a display device corresponding to a digital image signal is exemplified. The source signal line driver circuit has a shift register (SR) 1401, a first latch circuit (LAT1) 1402, and a second latch circuit (LAT2) 1403. Reference numeral 1404 denotes a pixel, and reference numeral 1405 is a brightness correction device shown in FIG. 1.

Operations of each portion are explained. Sampling pulses are output one after another from the shift register in accordance with a clock signal (CLK) and a start pulse (SP). Storage of a digital image signal is performed in the first latch circuit in accordance with the timing of the sampling pulses. Correction of the image signal is already completed at this point, and it becomes a second image signal, as shown in FIG. 14A. A latch pulse is output when a storage of one horizontal period portion is complete in the first latch circuit, and the digital image signal is transferred to the second latch circuit. Thereafter, write in from the second latch circuit to the pixels is performed. At the same time, storage of the digital image signal in the first latch circuit is again performed in accordance with the sampling pulse from the shift register.

Operation of the overall brightness correction device is explained next. First, the brightness with respect to the input of a certain gray scale signal is stored in the correction data storage portion 102 in advance, as a standard brightness for the EL elements used in the self light emitting device. Correction of the image signal is performed for the EL elements of each pixel in accordance with the deviation from the standard brightnesses. Further, the standard brightnesses need not be limited to one certain gray scale, but standard brightnesses may be stored for a plurality of gray scales.

A test pattern is next input to the display device, and screen display is performed. It is preferable that the test pattern be a pattern such as a plain intermediate display or a white display. The above-mentioned standard brightnesses are the standard brightnesses occurring in those gray scales. In addition to the standard brightnesses, the amount of change in the brightness per single gray scale in a certain number of bits is also stored in the correction data storage portion 102. Results of detection here are temporarily stored in the memory circuit 104. The brightnesses are then detected by the photoelectric conversion elements formed in each pixel in the pixel portion while the EL elements are turned on in accordance with the test pattern. For example, if degradation develops in a certain EL element due to any cause, normally the brightness of the EL element will drop. A difference in brightness therefore arises between the detected brightness and the standard brightness even if the same gray scale signal is displayed. The brightness difference is computed for several gray scales of the digital image signal currently used, correction is added to a first image signal 101A for the computed gray scales in each pixel, and a second image signal 101B is obtained, and then input to the display device.

It is necessary to use non-volatile memory such as flash memory in the correction data storage portion 102 and for the test pattern 103 in structuring the memory circuit portion 100. Further, the brightness detection results are always refreshed when the electric power source is connected as stated above, and therefore volatile memory may also be used in the memory circuit 104. Memory such as static memory (SRAM), dynamic memory (DRAM), and ferroelectric memory (FRAM) may be used as volatile memory. However, there are no specific limitations placed on the structure of the memory circuit in the present invention.

A brightness detection procedure by the photoelectric conversion elements 106 is as follows. It is preferable that refresh of the memory circuit 104 is always performed for times of normal image display. It is preferable to perform correction of the image signal in real time, but considering the actual operation of the photoelectric conversion elements 106, this is difficult due to the amount of time required, and therefore an example of performing the above procedures when the electric power source is connected to the self light emitting device is given as one method. It is of course possible to know to what extent the brightnesses of the EL elements have dropped by comparing the first image signal with brightnesses detected in real time during display of the image obtained by input of the first image signal, provided that the photoelectric conversion elements used have a fast response time. Correction operations can therefore also be performed during image display.

Note that characteristics such as small size, high speed response, stability, linearity with respect to incident light, and high detection sensitivity are sought for the photoelectric conversion elements used in the self light emitting device of the present invention. It is therefore preferable to use photodiodes in the self light emitting device of the present invention due to these requirements. In particular, PN junction photodiodes and PIN junction photodiodes are easily formed during processing, as explained later in embodiments, and can be formed very small, and as such, are particularly preferable. Note that diodes such as avalanche diodes can also be given as other photodiodes, and that any of these photodiodes may be used in structuring the present invention.

Furthermore, a switch 113 is used in switching the inputs between the test pattern and the normal digital image signal in the figures shown by the embodiment mode, but there are no particular limitations placed on this, and other methods may also be used.

Embodiments

Embodiments of the present invention are discussed below.

Embodiment 1

A method of achieving a brightness equal to that of a normal EL element by adding a certain corrective value to an input digital image signal and effectively converting it to a signal of several gray scales higher, can be given as one method of correcting insufficient brightness in degraded EL elements by using the image signal level. The easiest method to realize this by circuit design, a circuit capable of processing the superimposition gray scales is prepared beforehand. Specifically, for a case of a six bit digital gray scale (64 gray scales) self light emitting device of the present invention having a brightness correction function, for example, a one bit of processing capability is added as superimposition means for performing correction. This is effectively designed as seven bit digital gray scales (128 gray scales), manufactured, and in normal operation, the lower six bits are used. If an EL element develops degradation, the corrective value is added to the normal digital image signal, and signal processing of the added portion is performed using the above one bit for superimposition. The most significant bit (MSB) is used only for signal correction in this case, and the actual display gray scale is six bit.

Embodiment 2

A method of correcting a digital image signal, differing from the method of embodiment 1, is explained in embodiment 2.

Figure 2A:
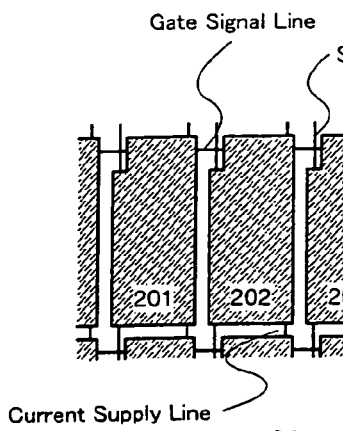
FIGS. 2A to 2E are diagrams showing a correction method in accordance with addition processing.
Figure 2B:
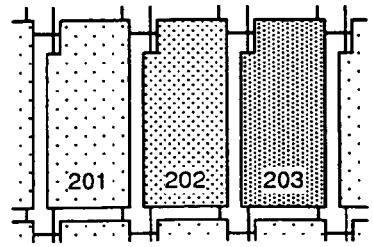

Refer to FIG. 1 and FIGS. 2A to 2E. FIG. 2A shows a portion of a pixel of the display device 108 in FIG. 1. Note that, for simplicity, photoelectric conversion elements arranged in a pixel portion are not shown in the figures.

Three pixels, pixels 201 to 203, are considered here. First, the pixel 201 is a pixel which does not develop degradation, while both the pixels 202 and 203 develop a certain amount of degradation. If the amount of degradation in the pixel 203 is taken as being larger than that of the pixel 202, then the brightness reduction also naturally becomes larger along with the degradation. In other words, if a certain intermediate gray scale is displayed, then brightness irregularities develop as in FIG. 2B. The brightness of the pixel 202 becomes lower than the brightness of the pixel 201, and further, the brightness of the pixel 203 becomes lower.

Actual correction operation is explained next. Brightness correction by addition processing is explained first.

Values of the brightness of EL elements which are turned on due to a certain gray scale signal are measured in advance, and taken as standard brightnesses. The standard brightnesses are stored in the correction data storage portion 102 along with the amount of change in the brightness per one gray scale of a certain digital image signal. Display is then performed in accordance with a certain test pattern, and the brightnesses of each pixel within the screen are detected by the photoelectric conversion elements 106, and converted into signals. The standard brightnesses and the results of detecting the brightnesses in each pixel are input to the correction circuit 105. The results of detecting the brightness in each pixel are temporarily stored in the memory circuit 104, and then read out and input to the correction circuit 105.

Figure 2C:
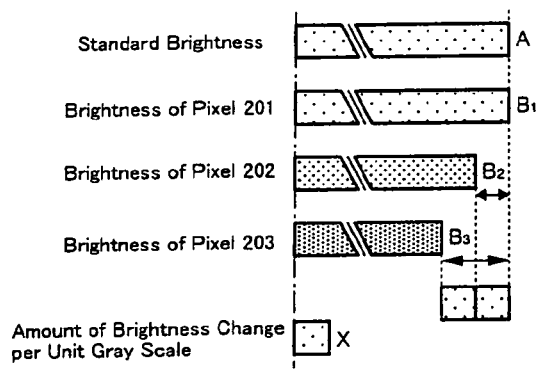

Computation is performed next in the correction circuit 105 from the input values, the amount of correction to the digital image signal written into each pixel is determined, and actual correction is performed. One example is shown in FIG. 2C. With respect to a standard brightness A, the brightness of the pixel 201 is taken as $B_1$, the brightness of the pixel 202 is taken as $B_2$, and the brightness of the pixel 203 is taken as $B_3$. The correction widths for the digital image signal are found by taking the differences between the standard brightness A and the detected brightnesses $B_1$ to $B_3$, and dividing by amounts of brightness change X per unit gray scale. Here, the correction amount is 0 for the pixel 201, the correction amount is 1 for the pixel 202, and the correction amount is 2 for the pixel 203, as shown in FIG. 2C. The brightness differences are approximated when falling within one gray scale to determine the amounts of correction. In this case, the brightness of a 0.5 gray scale portion is taken as a boundary, for example, and rounding up or rounding down may be selected or uniform processing may be performed by selecting one of them.

Figure 2D:
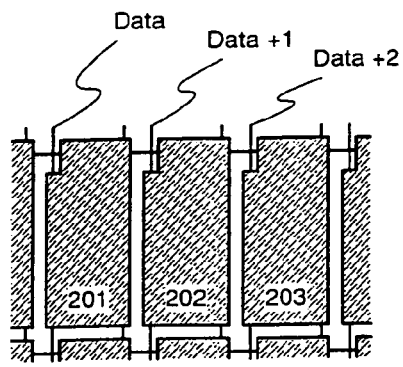
Figure 2E:
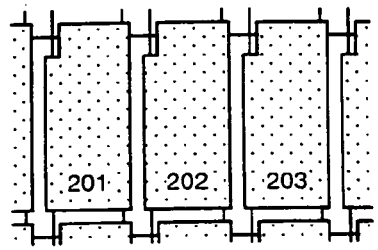

Brightness correction is performed by determining the amount of correction widths in each pixel by the above method, and successively adding correction signals to the gray scale signals with the first image signal 101A input to the correction circuit 105. As shown in FIGS. 2D and 2E, the digital image signals input to each pixel are superimposed by gray scales for the correction widths found, and brightnesses equal to those of normal EL elements are obtained. The second image signal 101B, with which correction is thus completed, is then input to the display device 108 and image display is performed.

Figure 3A:
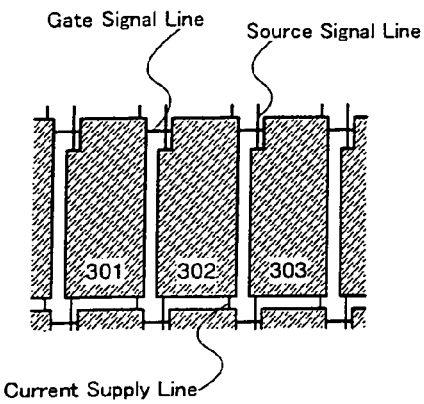
FIGS. 3A to 3E are diagrams showing a correction method in accordance with subtraction processing.
Figure 3B:
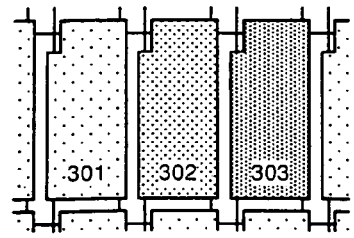

A correction method in accordance with subtraction processing is discussed next. FIG. 1 and FIGS. 3A to 3E are referred to. FIGS. 3A and 3B are identical to FIGS. 2A and 2B, respectively, and therefore an explanation of FIGS. 3A and 3B is omitted here.

Figure 3C:
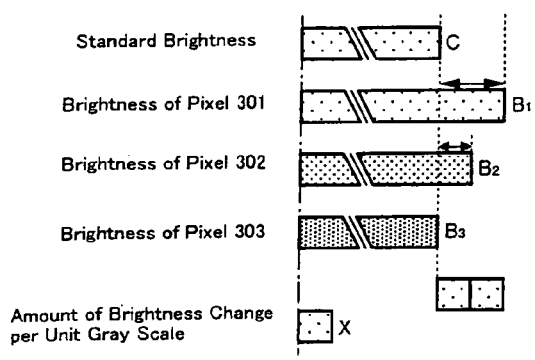

Similar to addition processing discussed above, the brightnesses of each pixel are detected by the photoelectric conversion elements, are read into the correction circuit along with the standard brightnesses, and correction of the digital image signal is performed. The brightness in the pixel thought to have the most advanced degradation (the lowest brightness) in the pixel portion is taken as the standard brightness at this point. The brightness of a pixel 301 is taken as $B_1$, the brightness of a pixel 302 is taken as $B_2$, and the brightness of a pixel 303 is taken as $B_3$ with respect to a standard brightness C. The correction widths for the digital image signal are found by taking the differences between the standard brightness C and the detected brightnesses $B_1$, to $B_3$, and dividing by amounts of brightness change X per unit gray scale. The correction amount is −2 for the pixel 301 here, the correction amount is −1 for the pixel 302, and the correction amount is 0 for the pixel 303, as shown in FIG. 3C. The brightness differences are approximated when falling within one gray scale to determine the amounts of correction. In this case, the brightness of a 0.5 gray scale portion is taken as a boundary, for example, and rounding up or rounding down may be selected or uniform processing may be performed by selecting one of them.

Brightness correction is performed by determining the correction widths in each pixel by the above method, and successively lowering the gray scales of the digital image signal by the amount of correction with the first image signal 101A input to the correction circuit 105. As shown in FIGS. 2D and 2E, the gray scales for the correction widths found are subtracted from the digital image signals input to each pixel, and the brightnesses are suppressed to brightnesses equal to that of the EL element in which the brightness has dropped the most. The second image signal 101B, with which correction is thus completed, is then input to the display device 108.

Figure 3D:
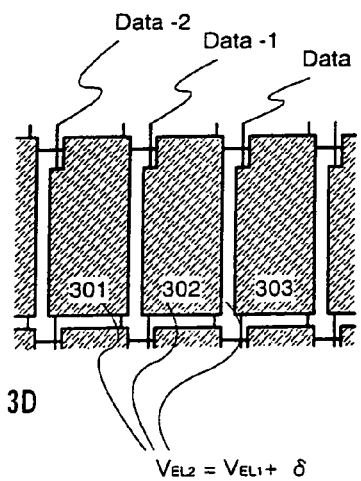
Figure 3E:
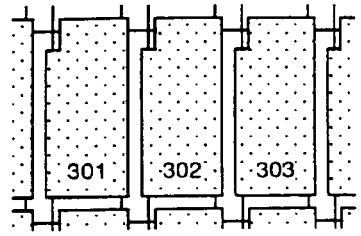

However, if correction is performed in accordance with the above procedure, the brightness of the overall screen becomes reduced by several gray scales (the difference between the gray scale of the original digital image signal and the gray scale of the second image signal written into the pixels in which EL element degradation has not developed). A normal, uniform screen picture is obtained as shown in FIG. 3E in accordance with correcting the brightness of the entire screen by slightly increasing the voltage $V_{EL}$ between both electrodes of the EL elements ($V_{EL1}+\delta \rightarrow V_{EL2}$) by changing the electric potential of the electric current supply line, as shown in FIG. 3D.

For the former case of correction by addition processing, it is possible to correct the brightness irregularities by only performing digital image signal processing, but there is a disadvantage in that correction in white display is not effective (specifically, for a case of a six bit digital image signal, for example, in which "111111" is input, it is not possible to make further additions). Further, for the latter case of correction by subtraction processing, electric potential control of the electric current supply line is added for brightness correction, but the range in which correction is not effective is the black display range, the opposite of the addition processing correction, and therefore there are almost no poor influences. (specifically, for a case of a six bit digital image signal, for example, in which "000000" is input, it is not necessary to perform further subtractions, and normal black display is possible between normal EL elements and EL elements which have degraded (the EL elements are simply in a non-turned on state). Further, there will be almost no problems for a number of gray scales in the vicinity of black, provided that the number of corresponding bits of the display device is somewhat high.) Both methods are advantageous methods for multiple gray scales.

Further, for example, it is also effective to suppress the demerits of both methods by using them jointly in a method of correction with both addition processing and subtraction processing, taking a certain gray scale as a boundary.

On the other hand, after displaying a test pattern temporarily when the electric power source is connected and detecting the brightnesses of each pixel, the image signal input system is switched over to normal operation (performed by the switch 113 shown in FIG. 1 with the examples of this specification), a digital image signal is input, and image display is performed.

Embodiment 3

Figure 4A:
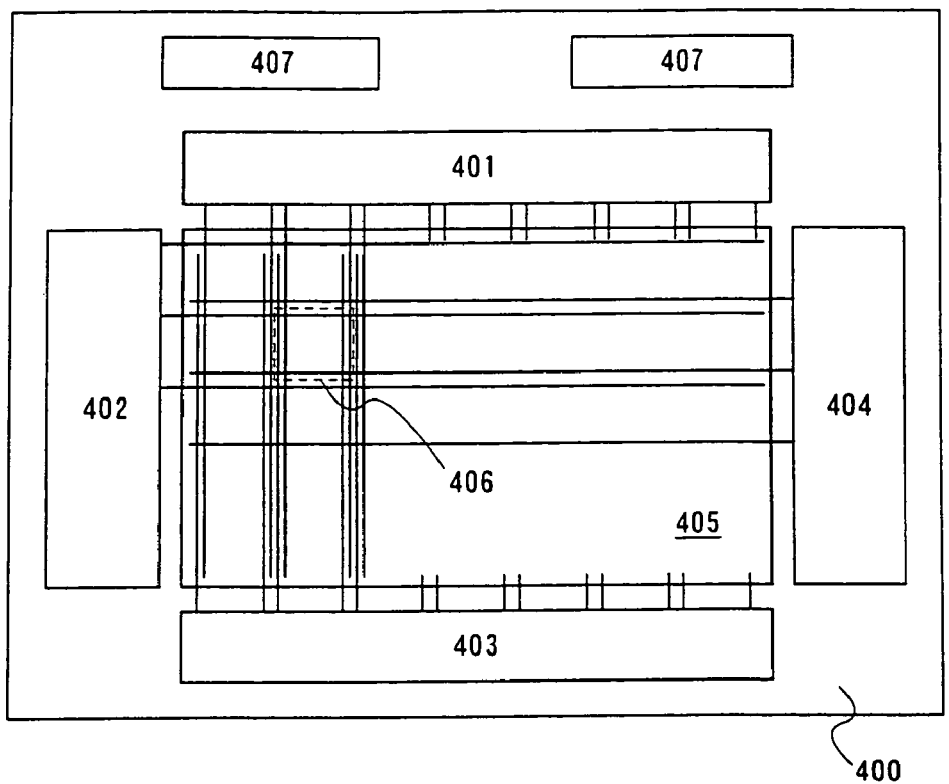
FIGS. 4A and 4B are a block diagram of a display device in a self light emitting device of the present invention having brightness detection and correction functions, and an equivalent circuit diagram of a pixel portion, respectively.
Figure 4B:
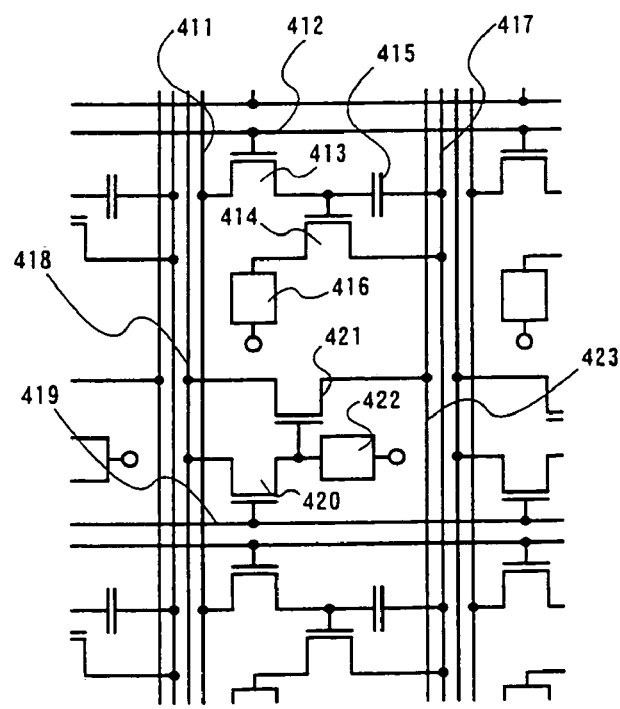

Details of the display device 108 in the schematic diagram shown in FIG. 1 are explained using FIGS. 4A and 4B. FIG. 4A is a schematic diagram of the entire display device, and FIG. 4B is an equivalent circuit diagram of a pixel portion. A pixel portion 405 is arranged in the center of a substrate 400 in FIG. 4A. Pixels 406, each having an EL element and a photoelectric conversion element, are arranged in a matrix shape in the pixel portion 405, as explained later. An EL source signal line driver circuit 401, an EL gate signal line driver circuit 402, a photoelectric conversion element signal line driver circuit 403, and a photoelectric conversion element scanning line driver circuit 404 are arranged in the periphery of the pixel portion 405. One each of the driver circuits are arranged in the periphery of the pixel portion in embodiment 3, but different circuit arrangements may also be used, such as the EL source signal line driver circuit 401 and the photoelectric conversion element signal line driver circuit 403, or the EL gate signal line driver circuit 402 and the photoelectric conversion element scanning line driver circuit 404, for example, being integrated into one circuit, and the circuits being arranged on both sides opposing the pixel portion. Supply of signals and an electric power source to each of the driver circuits is performed through an FPC 407.

FIG. 4B is a blow up of the pixels 406. One pixel is structured by a source signal line 411, a gate signal line 412, a switching TFT 413, an EL driver TFT 414, a storage capacitor 415, an EL element 416, an electric current supply line 417, a signal output line 418, a reset signal line 419, a scanning line 420, a standard electric power source line 421, a reset TFT 422, a buffer TFT 423, a selection TFT 424, and a photoelectric conversion element 425. The storage capacitor 415 is arranged in order to store an electric charge imparted to a gate electrode of the EL driver TFT 414, but it is not always necessary for the storage capacitor 415 to be used.

Turn on of the EL element has already been discussed, and will therefore be omitted here. Only operation in the periphery of the photoelectric conversion element during brightness detection in each pixel is discussed here. The selection TFT 424 is placed in a conductive state when a selection pulse is input to the scanning line 420. Light from the EL element 416 is made incident to the photoelectric conversion element 425 with this state, the buffer TFT 423 is made conductive in accordance with the electric charge accumulated in the photoelectric conversion element 425, and the brightness is converted to an electric signal and output to the signal output line 418. The signal is amplified using a buffer, an operational amplifier and the like in the signal line driver circuit 403, and a voltage signal is obtained. This is then read into a correction circuit through means such as an A/D converter.

Embodiment 4

With the example shown by the embodiment mode (FIG. 1), the brightness correcting device is placed outside the display device 108 in the self light emitting device of the present invention having a brightness correction function, and the digital image signal (first image signal) 101A is first input to the correction circuit 105, where correction is immediately performed, and then the corrected digital image signal (second image signal) 101B is input to the display device 108 through an FPC. Examples of merits of this method include a high amount of compatibility due to making each device into a unit, and good applicability, but on the other hand, lower costs, conservation of space, and high speed drive can be realized due to a large reduction in the number of parts by forming the brightness correction device and the display device integrated on the same substrate. No particular layout on the substrate is shown here, but considering such things as the arrangement of signal lines and the length of wiring, it is preferable to have adjacent arrangement block by block.

Embodiment 5

In Embodiment 5, a method of manufacturing TFTs of a pixel portion, a driver circuit portion (source signal line driver circuit, gate signal line driver circuit and pixel selection signal line driver circuit) formed in the periphery thereof in an active EL display device of the present invention simultaneously is explained. Note that a CMOS circuit which is a base unit is illustrated as the driver circuit portion to make a brief explanation.

First, as shown in FIG. 5A, a substrate 5000 is used, which is made of glass such as barium borosilicate glass or alumino borosilicate glass, typified by #7059 glass or #1737 glass of Corning Inc. There is no limitation on the substrate 5000 as long as a substrate having a light transmitting property is used, and a quartz substrate may also be used. In addition, a plastic substrate having heat resistance to a treatment temperature of this embodiment may also be used.

Then, a base film 5001 formed of an insulating film such as a silicon oxide film, a silicon nitride film or a silicon oxynitride film is formed on the substrate 5000. In this embodiment, a two-layer structure is used for the base film 5001. However, a single layer film or a lamination structure consisting of two or more layers of the insulating film may also be used. As a first layer of the base film 5001, a silicon oxynitride film 5001a is formed with a thickness of 10 to 200 nm (preferably 50 to 100 nm) using $SiH_4$, $NH_3$, and $N_2O$ as reaction gases by a plasma CVD method. In this embodiment, the silicon oxynitride film 5001a (composition ratio Si=32%, O=27%, N=24% and H=17%) having a film thickness of 50 nm is formed. Then, as a second layer of the base film 5001, a silicon oxynitride film 5001b is formed so as to be laminated on the first layer with a thickness of 50 to 200 nm (preferably 100 to 150 nm) using $SiH_4$ and $N_2O$ as reaction gases by the plasma CVD method. In this embodiment, the silicon oxynitride film 5001b (composition ratio Si=32%, O=59%, N=7% and H=2%) having a film thickness of 100 nm is formed.

Subsequently, semiconductor layers 5002 to 5004 are formed on the base film. The semiconductor layers 5002 to 5004 are formed such that a semiconductor film having an amorphous structure is formed by a known method (a sputtering method, an LPCVD method, a plasma CVD method or the like), and is subjected to a known crystallization process (a laser crystallization method, a thermal crystallization method, a thermal crystallization method using a catalyst such as nickel, or the like) to obtain a crystalline semiconductor film, and the crystalline semiconductor film is patterned into desired shapes. The semiconductor layers 5002 to 5004 are formed with a thickness of 25 to 80 nm (preferably 30 to 60 nm). The material of the crystalline semiconductor film is not particularly limited, but it is preferable to form the film using silicon, a silicon germanium ($Si_xGe_{1-x}$ (X=0.0001 to 0.02)) alloy, or the like. In this embodiment, an amorphous silicon film of 55 nm thickness is formed by a plasma CVD method, and then, a nickel-containing solution is held on the amorphous silicon film. A dehydrogenation process of the amorphous silicon film is performed (at 500° C. for 1 hour), and thereafter a thermal crystallization process is performed (at 550° C. for 4 hours) thereto. Further, to improve the crystallinity, a laser annealing process is performed to form the crystalline silicon film. Then, this crystalline silicon film is subjected to a patterning process using a photolithography method to obtain the semiconductor layers 5002 to 5004.

Further, after the formation of the semiconductor layers 5002 to 5004, a minute amount of impurity element (boron or phosphorus) may be doped to control a threshold value of the TFT.

Besides, in the case where the crystalline semiconductor film is manufactured by the laser crystallization method, a pulse oscillation type or continuous emission type excimer laser, YAG laser, or YVO$_4$ laser may be used. In the case where those lasers are used, it is appropriate to use a method in which laser light radiated from a laser oscillator is condensed into a linear shape by an optical system, and is irradiated to the semiconductor film. Although the conditions of crystallization should be properly selected by an operator, in the case where the excimer laser is used, a pulse oscillation frequency is set to 30 Hz, and a laser energy density is set to 100 to 400 mJ/cm$^2$ (typically 200 to 300 mJ/cm$^2$). In the case where the YAG laser is used, it is appropriate to set a pulse oscillation frequency as 1 to 10 Hz using the second harmonic, and to set a laser energy density to 300 to 600 mJ/cm$^2$ (typically, 350 to 500 mJ/cm$^2$). Then, laser light condensed into a linear shape with a width of 100 to 1000 μm, for example, 400 μm, is irradiated to the whole surface of the substrate, and an overlapping ratio (overlap ratio) of the linear laser light at this time may be set to 50 to 90%.

A gate insulating film 5005 is then formed for covering the semiconductor layers 5002 to 5004. The gate insulating film 5005 is formed of an insulating film containing silicon with a thickness of 40 to 150 nm by a plasma CVD or sputtering method. In this embodiment, the gate insulating film 5005 is formed of a silicon oxynitride film with a thickness of 110 nm by the plasma CVD method (composition ratio Si=32%, O=59%, N=7%, and H=2%). Of course, the gate insulating film is not limited to the silicon oxynitride film, and other insulating films containing silicon may be used with a single layer or a lamination structure.

Besides, when a silicon oxide film is used, it can be formed such that TEOS (tetraethyl orthosilicate) and O$_2$ are mixed by the plasma CVD method with a reaction pressure of 40 Pa and a substrate temperature of 300 to 400° C., and discharged at a high frequency (13.56 MHz) power density of 0.5 to 0.8 W/cm$^2$. The silicon oxide film thus manufactured can obtain satisfactory characteristics as the gate insulating film by subsequent thermal annealing at 400 to 500° C.

Then, a first conductive film 5006 of 20 to 100 nm thickness and a second conductive film 5007 of 100 to 400 nm thickness are formed into lamination on the gate insulating film 5005. In this embodiment, the first conductive film 5006 made of a TaN film with a thickness of 30 nm and the second conductive film 5007 made of a W film with a thickness of 370 nm are formed into lamination. The TaN film is formed by sputtering with a Ta target under a nitrogen containing atmosphere. Besides, the W film is formed by sputtering with a W target. The W film may also be formed by a thermal CVD method using tungsten hexafluoride (WF$_6$). Whichever method is used, it is necessary to make the material have low resistance for use as a gate electrode, and it is preferred that the resistivity of the W film is set to 20 μΩcm or less. It is possible to make the W film have low resistance by making the crystal grains large. However, in the case where many impurity elements such as oxygen are contained within the W film, crystallization is inhibited and the resistance becomes higher. Therefore, in this embodiment, the W film is formed by sputtering using a W target having a high purity of 99.9999%, and also by taking sufficient consideration so as to prevent impurities within the gas phase from mixing therein during the film formation, and thus, a resistivity of 9 to 20 μΩcm can be realized.

Note that, in this embodiment, the first conductive film 3006 is made of TaN, and the second conductive film 5007 is made of W, but the material is not particularly limited thereto, and either film may be formed from an element selected from the group consisting of Ta, W, Ti, Mo, Al, Cu, Cr, and Nd or an alloy material or a compound material containing the above element as its main constituent. Besides, a semiconductor film typified by a polycrystalline silicon film doped with an impurity element such as phosphorus may be used. An alloy made of Ag, Pd, and Cu may also be used. Further, any combination may be employed such as a combination in which the first conductive film is formed of a tantalum (Ta) film and the second conductive film is formed of a W film, a combination in which the first conductive film is formed of a titanium nitride (TiN) film and the second conductive film is formed of a W film, a combination in which the first conductive film is formed of a tantalum nitride (TaN) film and the second conductive film is formed of an Al film, or a combination in which the first conductive film is formed of a tantalum nitride (TaN) film and the second conductive film is formed of a Cu film.

Next, as shown in FIG. 5B, masks 5008 made of resist are formed by using a photolithography method, and a first etching process for forming electrodes and wirings is carried out. In the first etching process, first and second etching conditions are used. In this embodiment, as the first etching condition, an ICP (inductively coupled plasma) etching method is used, in which CF$_4$, Cl$_2$, and O$_2$ are used as etching gases, a gas flow rate is set to 25/25/10 sccm, and an RF (13.56 MHz) power of 500 W is applied to a coil shape electrode under a pressure of 1 Pa to generate plasma. Thus, the etching is performed. A dry etching device using ICP (Model E645-ICP) manufactured by Matsushita Electric Industrial Co. is used here. A 150 W RF (13.56 MHz) power is also applied to the substrate side (sample stage), thereby substantially applying a negative self-bias voltage. The W film is etched under the first etching condition, and the end portion of the first conductive layer is formed into a tapered shape. In the first etching condition, the etching rate for W is 200.39 nm/min, the etching rate for TaN is 80.32 nm/min, and the selectivity of W to TaN is about 2.5. Further, the taper angle of W is about 26° under the first etching condition.

Thereafter, as shown in FIG. 5B, the etching condition is changed into the second etching condition without removing the masks 5008 made of resist, and the etching is performed for about 30 seconds, in which CF$_4$ and Cl$_2$ are used as the etching gases, a gas flow rate is set to 30/30 sccm, and an RF (13.56 MHz) power of 500 W is applied to a coil shape electrode under a pressure of 1 Pa to generate plasma. An RF (13.56 MHz) power of 20 W is also applied to the substrate side (sample stage), and a substantially negative self-bias voltage is applied thereto. In the second etching condition in which CF$_4$ and Cl$_2$ are mixed, the W film and the TaN film are etched to the same degree. In the second etching condition, the etching rate for W is 58.97 nm/min, and the etching rate for TaN is 66.43 nm/min. Note that, in order to perform the etching without leaving any residue on the gate insulating film, it is appropriate that an etching time is increased by approximately 10 to 20%.

In the above first etching process, by making the shapes of the mask 5008 formed of resist suitable, end portions of the first conductive layer and the second conductive layer become tapered shape by the effect of the bias voltage applied to the substrate side. The angle of the taper portion may be 15 to 45°. In this way, first shape conductive layers 5009 to 5013 consisting of the first conductive layer and the second conductive layer (first conductive layers 5009a to 5013a and second conductive layers 5009b to 5013b) are formed by the first etching process. Reference numeral 5005 indicates a gate insulating film, and the regions not covered with the first shape conductive layers 5009 to 5013 are made thinner by approximately 20 to 50 nm by etching.

Then, a first doping process is performed to add an impurity element imparting n-type conductivity to the semiconductor layer without removing the mask 5008 made of resist (FIG. 5B). Doping may be carried out by an ion doping method or an ion injecting method. The condition of the ion doping method is that a dosage is $1 \times 10^{13}$ to $5 \times 10^{15}$ atoms/cm$^2$, and an acceleration voltage is 60 to 100 keV. In this embodiment, the dosage is $1.5 \times 10^{15}$ atoms/cm$^2$ and the acceleration voltage is 80 keV. As the impurity element imparting n-type conductivity, an element belonging to group 15 of the periodic table, typically phosphorus (P) or arsenic (As) is used, but phosphorus (P) is used here. In this case, the conductive layers 5009 to 5012 become masks for the impurity element imparting n-type conductivity, and high concentration impurity regions 5014 to 5016 are formed in a self-aligning manner. The impurity element imparting n-type conductivity in a concentration range of $1 \times 10^{20}$ to $1 \times 10^{21}$ atoms/cm$^3$ is added to the high concentration impurity regions 5014 to 5016.

Thereafter, as shown in FIG. 5C, a second etching process is performed without removing the masks made of resist. Here, a gas mixture of $CF_4$, $Cl_2$ and $O_2$ is used as an etching gas, the gas flow rate is set to 20/20/20 sccm, and a 500 W RF (13.56 MHz) power is applied to a coil shape electrode under a pressure of 1 Pa to generate plasma, thereby performing etching. A 20 W RF (13.56 MHz) power is also applied to the substrate side (sample stage), thereby substantially applying a negative self-bias voltage. In the second etching process, the etching rate for W is 124 nm/min, the etching rate for TaN is 20 nm/min, and the selectivity of W to TaN is 6.05. Accordingly, the W film is selectively etched. The taper angle of W is 70° by the second etching process. Second conductive layers 5017b to 5021b are formed by the second etching process. On the other hand, the first conductive layers 5009a to 5013a are hardly etched, and first conductive layers 5017a to 5021a are formed.

Next, a second doping process is performed. The second conductive layers 5017b to 5020b are used as masks for an impurity element, and doping is performed such that the impurity element is added to the semiconductor layer below the tapered portions of the first conductive layers. In this embodiment, phosphorus (P) is used as the impurity element, and plasma doping is performed with a dosage of $1.5 \times 10^{14}$ atoms/cm$^2$, a current density of 0.5 µA, and an acceleration voltage of 90 keV. Thus, low concentration impurity regions 5022 to 5024, which overlap with the first conductive layers, are formed in self-aligning manner. The concentration of phosphorus (P) added to the low concentration impurity regions 5022 to 5024 is $1 \times 10^{17}$ to $5 \times 10^{18}$ atoms/cm$^3$, and has a gentle concentration gradient in accordance with the film thickness of the tapered portions of the first conductive layers. Note that in the semiconductor layers that overlap with the tapered portions of the first conductive layers, the concentration of the impurity element slightly falls from the end portions of the tapered portions of the first conductive layers toward the inner portions, but the concentration keeps almost the same level. Further, an impurity element is added to the high concentration impurity regions 5014 to 5016. (FIG. 6A)

Thereafter, as shown in FIG. 6B a third etching process is performed using a photolithography method. Mask made of resist 5025 are formed in the regions where the third etching process is not conducted. Incidentally the tapered portions of the first conductive layers are partially etched so as to have shapes overlapping the second conductive layers in the third etching process.

The etching condition in the third etching process is that $Cl_2$ and $SF_6$ are used as etching gases, the gas flow rate is set to 10/50 sccm, and the ICP etching method is used as in the first and second etching processes. Note that, in the third etching process, the etching rate for TaN is 111.2 nm/min, and the etching rate for the gate insulating film is 12.8 nm/min.

In this embodiment, a 500 W RF (13.56 MHz) power is applied to a coil shape electrode under a pressure of 1.3 Pa to generate plasma, thereby performing etching. A 10 W RF (13.56 MHz) power is also applied to the substrate side (sample stage), thereby substantially applying a negative self-bias voltage. Thus, first conductive layers 5026a to 5028a are formed.

Impurity regions (LDD regions) 5029 to 5030, which do not overlap with the first conductive layers 5026a to 5028a, are formed by the third etching process. Note that impurity region (GOLD regions) 5022 remains overlapping with the first conductive layers 5017a.

The impurity regions (LDD regions) 5029 and 5030 which do not overlap with the first conductive layers 5026a to 5028a, and the impurity region (GOLD region) 5022 which overlaps with the first conductive layer 5017a can thus be formed at the same time in embodiment 5, and it becomes possible to make the regions in response to the properties of the TFTs.

The gate insulating film 5005 is etched next after removing a mask 5025 formed of resist. $CHF_3$ is used as an etching gas, and reactive ion etching (RIE) is performed for this etching process. In embodiment 5, the etching process is performed with the chamber pressure set to 6.7 Pa, an RF electric power of 800 W, and a $CHF_3$ gas flow rate set to 35 sccm. Portions of the high concentration impurity regions 5014 to 5016 are thus exposed, and gate insulating films 5005a to 5005d are formed.

A new mask 5031 is then formed from resist, and a third doping process is performed. Impurity regions 5032 and 5033, to which an impurity element is added, that imparts the second conductivity type (p-type) opposite from that of the first conductivity type (n-type) to the semiconductor layers, which form active layers of p-channel TFTs; are formed by the third doping process. (See FIG. 3C.) The first conductive layer 5028a is used as a mask against the impurity element, impurity element imparting the p-type conductivity is added, and the impurity regions are formed in a self-aligning manner.

The impurity regions 5032 and 5033 are formed in embodiment 5 by ion doping using diborane ($B_2H_6$). Note that the semiconductor layers which form n-channel TFTs are covered by a mask 5031 formed from resist during the third doping process. Phosphorous is added to the impurity regions 5032 and 5033 in differing concentrations, respectively, by the first doping process and by the second doping process. However, doping is performed such that the concentration of the impurity element which imparts p-type conductivity to each of the regions becomes from $2 \times 10^{20}$ to $2 \times 10^{21}$ atoms/cm$^3$, and therefore no problems will develop with the regions functioning as source regions and drain regions of p-channel TFTs.

Impurity regions are formed in the respective semiconductor layers by the process up though this point. Note that, although a method for performing doping of an impurity (B) after etching the gate insulating film is shown in embodiment 5, doping of the impurity may also be performed without etching the gate insulating film.

The resist mask 5031 is removed next, and a first interlayer insulating film 5034 is formed as shown in FIG. 7A. An insulting film containing silicon is formed having a thickness of 100 to 200 nm, using plasma CVD or sputtering, as the first interlayer insulating film 5034. A silicon oxynitride film is formed with a film thickness of 150 nm by plasma CVD in embodiment 5. The first interlayer insulating film 5034 is of course not limited to a silicon oxynitride film, and other insulating films containing silicon may be used in a single layer or lamination layer structure.

A process for activating the impurity elements added to each of the semiconductor layers is performed next. Thermal annealing using an annealing furnace is performed for the activation process. Thermal annealing may be performed in a nitrogen atmosphere having an oxygen concentration less than or equal to 1 ppm, preferably less than or equal to 0.1 ppm, at 400 to 700° C., typically between 500 and 550° C. The activation process is performed in embodiment 5 by heat treatment at 550° C. for four hours. Note that, in addition to the thermal annealing, laser annealing and rapid thermal annealing (RTA) can also be applied.

Note also that, in embodiment 5, nickel used as a catalyst during crystallization is gettered into the impurity regions 5014, 5015, and 5032 containing a high concentration of phosphorous at the same time as the above activation process is performed. The nickel concentration within the semiconductor layers which mainly become channel forming regions is thus reduced. The value of the off current is reduced for TFTs having channel forming regions thus formed, and a high electric field effect mobility is obtained because of the good crystallinity. Thus, good properties can be achieved.

Further, the activation process may also be performed before forming the first interlayer insulating film 5034. However, when using a wiring material which is weak with respect to heat, it is preferable to perform the activation process after forming the interlayer insulating film 5034 (using an insulating material having silicon as its main constituent, silicon nitride film, for example) in order to protect the wirings or the like, as in embodiment 5.

The doping process may also be performed, and the first interlayer insulating film 5034 may also be formed, after performing the activation process.

In addition, heat treatment is performed for 1 to 12 hours at 300 to 550° C. in an atmosphere containing from 3 to 100% hydrogen, performing hydrogenation of the semiconductor layers. Heat treatment is performed for one hour at 410° C. in a nitrogen atmosphere containing approximately 3% hydrogen in embodiment 5. This process is one for terminating any dangling bonds of the semiconductor layers by hydrogen contained in the interlayer insulating film 5034. Plasma hydrogenation (using hydrogen excited by a plasma) may be performed as another means of hydrogenation.

Further, when using a laser annealing method as the activation process, it is preferable to irradiate laser light such as that from an excimer laser or a YAG laser after performing the above hydrogenation process.

A leveling film 5035 made from a material such as an organic resin is formed next, as shown in FIG. 7B. The leveling film 5035 is formed using acrylic, which has superior levelness, is used in embodiment 5, and with a film thickness sufficiently capable of leveling steps formed by the TFTs on the substrate. It is preferable that the film thickness be from 1 to 5 µm (more preferably, between 2 and 4 µm).

Contact holes are then formed in the first interlayer insulating film 5034 and in the leveling film 5035, and wirings 5036 to 5041 are formed. The wirings are formed in embodiment 5 by patterning a lamination film of a Ti film having a film thickness of 50 nm, and a composite film (a composite film of Al and Ti) having a film thickness of 500 nm, but other conductive films may also be used. Further, a gate signal line 5042 can be formed at the same-time by the same material as the wirings.

A second interlayer insulating film 5043 is formed next by plasma CVD from an insulating material containing silicon or from an organic resin. Silicon oxide, silicon nitride, and silicon oxynitride can be used as the insulating material containing silicon, and materials such as polyimide, polyamide, acrylic, and BCB (benzocyclobutene) can be used as the organic resin. Note that it is preferable that the film thickness of a silicon oxynitride film be from 1 to 5 µm (more preferably, between 2 and 4 µm). Silicon oxynitride films are effective in suppressing degradation of EL elements because the amount of moisture contained in the film is small.

A contact hole is formed next in order to reach the wiring 5037, and a cathode electrode 5044 of a photoelectric conversion element is formed. Aluminum formed by sputtering is used as a metallic film in embodiment 5, but other metals, for example, Ti, Ta, W, Cu, and the like can also be used. Further, the cathode electrode may also be formed from a lamination layer structure composed of a plurality of metallic films, not just a single layer.

An amorphous silicon film containing hydrogen is formed next, and is patterned, thereby forming a photoelectric layer 5045. A cathode electrode 5046 made from a transparent conductive film is similarly formed over the entire surface, and patterning is then performed to be formed.

Figure 8:
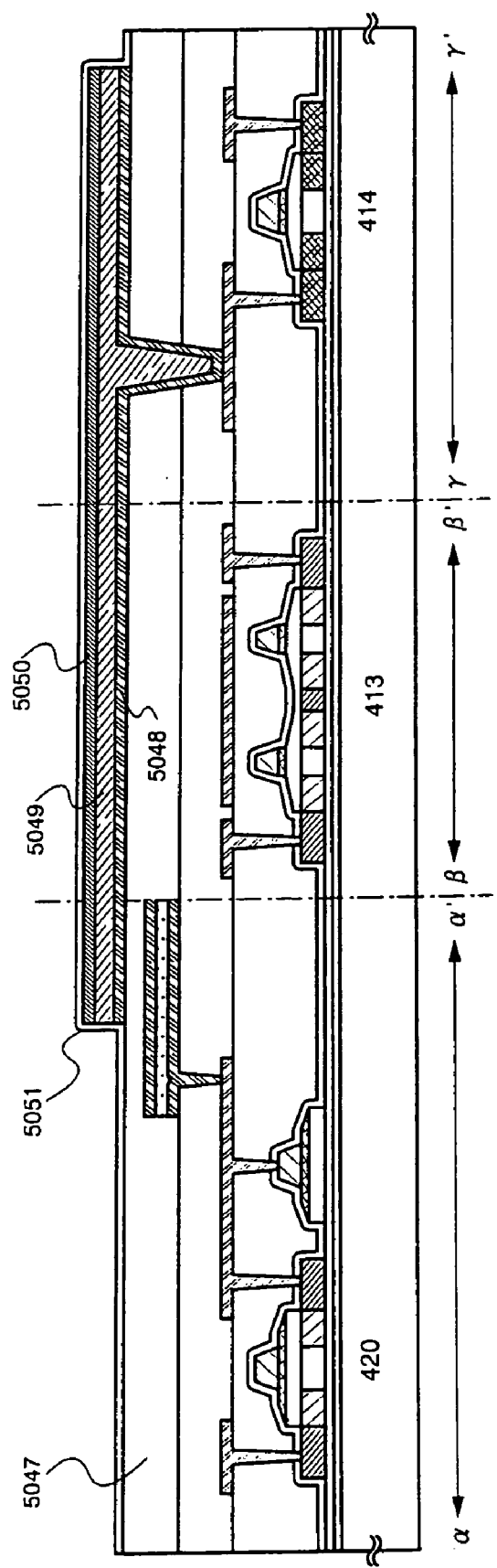
FIG. 8 is a diagram showing the example of a process of producing an active matrix self light emitting device.
Figure 9A:
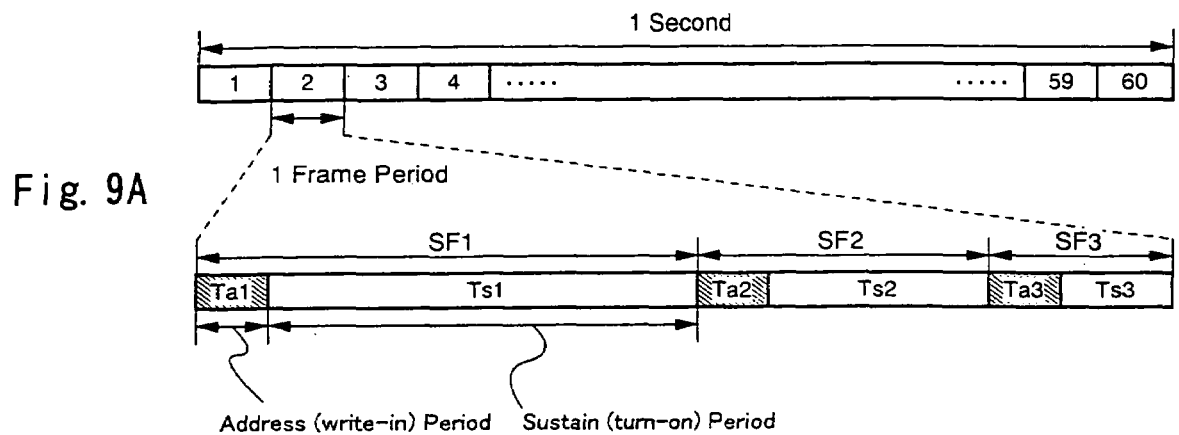
FIGS. 9A and 9B are diagrams for explaining a time gray scale method.
Figure 9B:
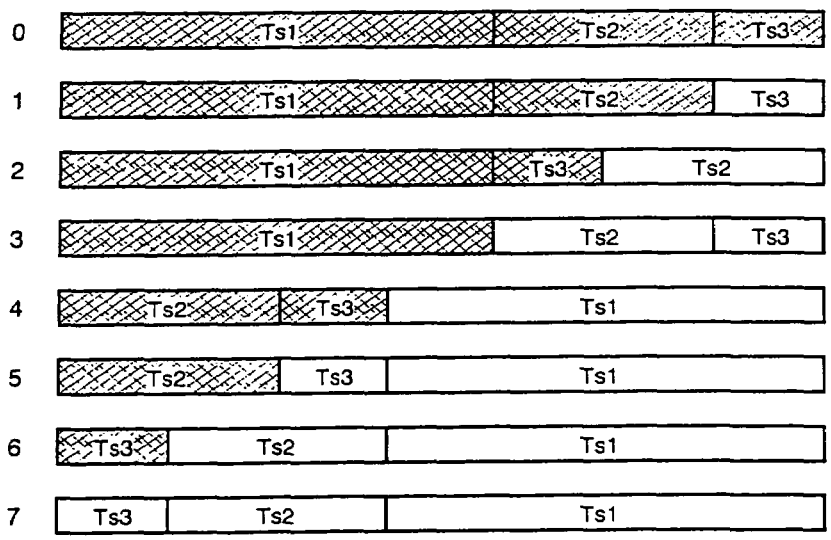
Figure 10A:
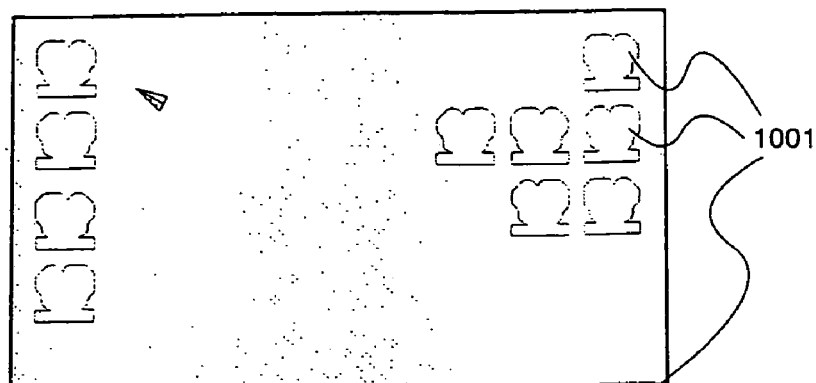
FIGS. 10A to 10C are diagrams showing the generation of brightness irregularities of a screen picture in accordance with degradation of light emitting elements.
Figure 10B:
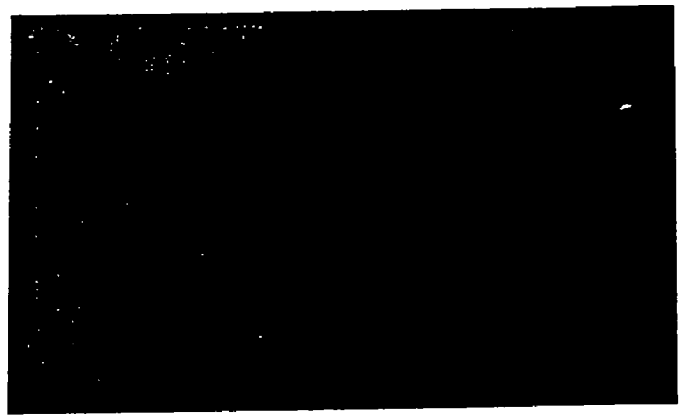
Figure 10C:
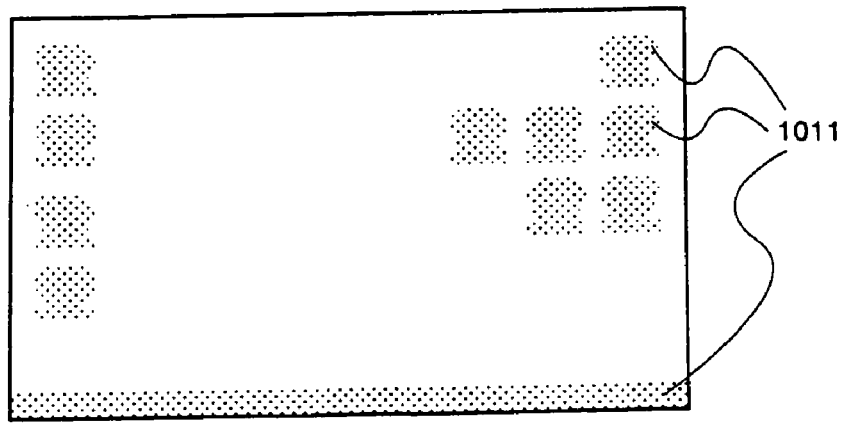

Next, as shown in FIG. 8A, a third interlayer insulating film 5047 is formed. A level surface can be obtained by using a resin such as polyimide, polyamide, polyimide amide, and acrylic as the third interlayer insulating film 5047. In embodiment 5, the polyimide film having a thickness of 0.7 µm was formed.

A pixel electrode 5048 is formed next by forming a transparent conductive film with a film thickness of 80 to 120 nm and then patterning, after forming a contact hole in order to reach the wiring 5040. (See FIG. 8A.) Note that an indium tin oxide (ITO) film, or transparent conductive film of indium oxide into which 2 to 20% zinc oxide (ZnO) is mixed, is used as the pixel electrode 5048 in embodiment 5.

An EL layer 5049 is formed next by evaporation, and in addition, a cathode electrode (MgAg electrode) 5050 is formed by evaporation. It is preferable to perform heat treatment on the pixel electrode 5048 before forming the EL layer 5049 and the cathode 5050, thereby completely removing all moisture. Note that, although an MgAg electrode is used as the cathode electrode of the EL element in embodiment 5, other known materials may also be used.

Note also that known materials can be used as the EL layer 5049. A two layer structure composed of a hole transporting layer and a light emitting layer is used as the EL layer in embodiment 5, but there are also cases in which one of a hole injecting layer, an electron injecting layer, and an electron transporting layer is formed. Many examples of these types of combinations have already been reported upon, and any of the reported structures may be used.

Polyphenylene vinylene is formed by evaporation as the hole transporting layer in embodiment 5. Further, a material in which from 30 to 40% of 1,3,4-oxydiazole dielectric PBD is distributed in polyvinyl carbazole is formed by evaporation as the light emitting layer, and approximately 1% cumarin 6 is added as a center of green color light emitting.

Further, it is preferable to form a film such as a protective film in order to protect the EL layer 5049 from oxygen and moisture. A 300 nm thick silicon nitride film is formed as a passivation film 5051 in embodiment 5. The passivation film 5051 may also be formed in succession after forming the cathode electrode 5050, without exposure to the atmosphere.

Note that the film thickness of the EL layer 5049 may be from 10 to 400 nm (typically between 60 and 150 nm), and the film thickness of the cathode electrode 5050 may be from 80 to 200 nm (typically between 100 and 150 nm).

An EL module having a structure like that shown in FIG. 8A is thus completed. Note that, although the source signal lines are formed by Ta and W, the materials which form the gate electrodes, and although the gate signal lines are formed by Al, the wiring material which forms the source and drain electrodes, in the process of manufacturing an EL display device in embodiment 5 due to the circuit structure and process considerations, other materials may also be used.

Figure 16:
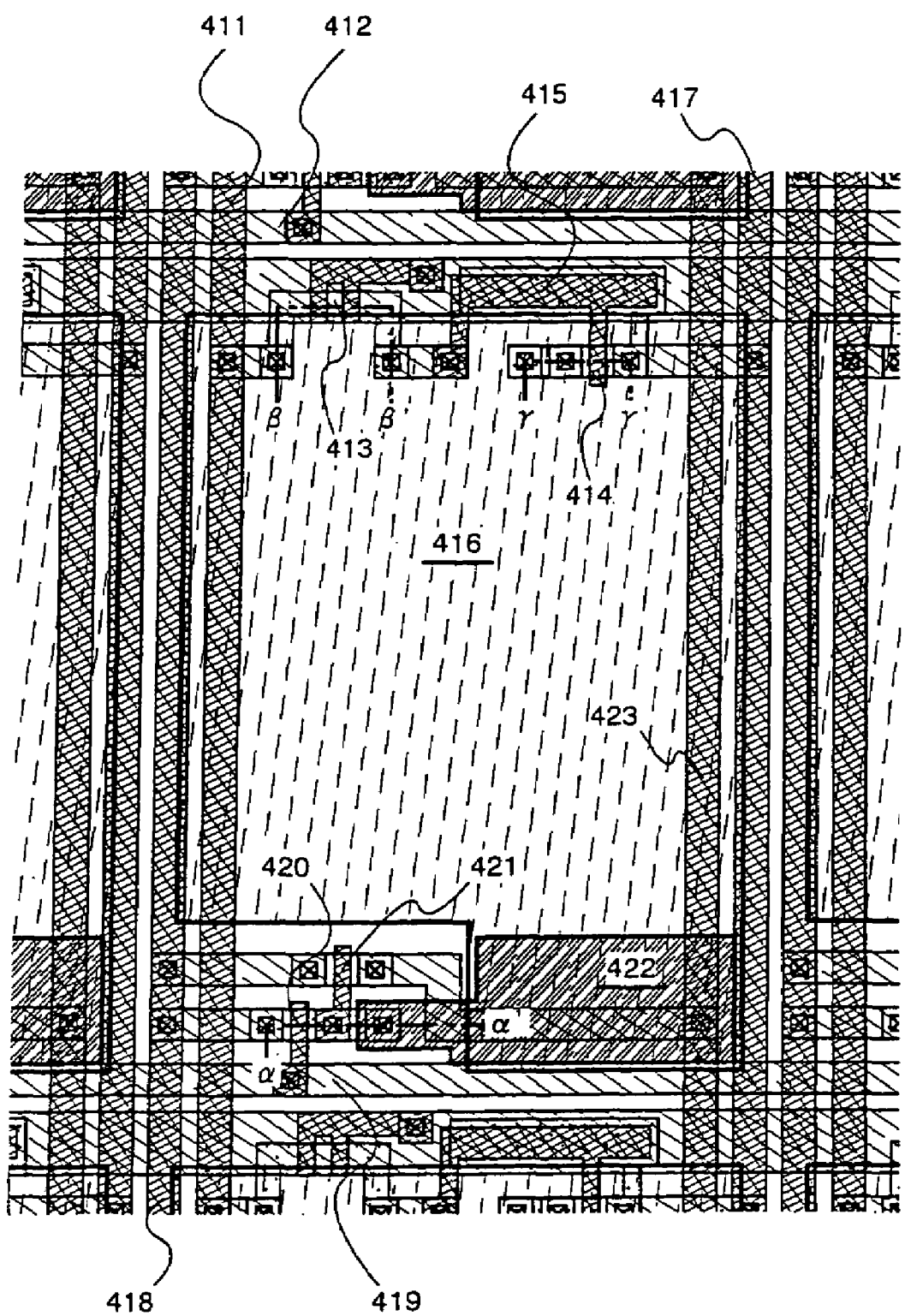
FIG. 16 is a diagram showing an example of a wiring pattern of a pixel portion in a self light emitting device of the present invention having brightness detection and correction functions.

FIG. 16 is an example of circuit arrangement of a pixel portion in a self light emitting device manufactured in accordance with the processes explained in embodiment 5. Reference numerals attached to each portion are identical to those used in the equivalent circuit of FIG. 4B. The lines α-α', β-β', and γ-γ' within FIGS. 5A to 8 correspond to cross sections of portions having the same reference numeral within FIG. 16.

A driver circuit composed of TFTs and the pixel portion shown in FIG. 8A can be formed on the same substrate by embodiment 5.

Note that light is irradiated below the surface from the EL elements in embodiment 5 (the light irradiation direction is to the TFT substrate side), and therefore a structure is shown in which an n-channel TFT is used for the switching TFT 413 and a p-channel TFT is used for the EL driver TFT 414. However, embodiment 5 is only one preferred embodiment, and it is not necessary to place any limitations on the structure.

Note also that a structure is shown in embodiment 5 in which the cathode electrode 5050 is formed after forming the EL layer 5049 on the pixel electrode (anode) 5048, but a structure in which an EL layer and an anode are formed on a pixel electrode (cathode) may also be used. Further, at this point it is preferable to structure the switching TFT and the EL driver TFT by n-channel TFTs having low concentration impurity regions (LDD regions) as explained in embodiment 5.

Figure 17:
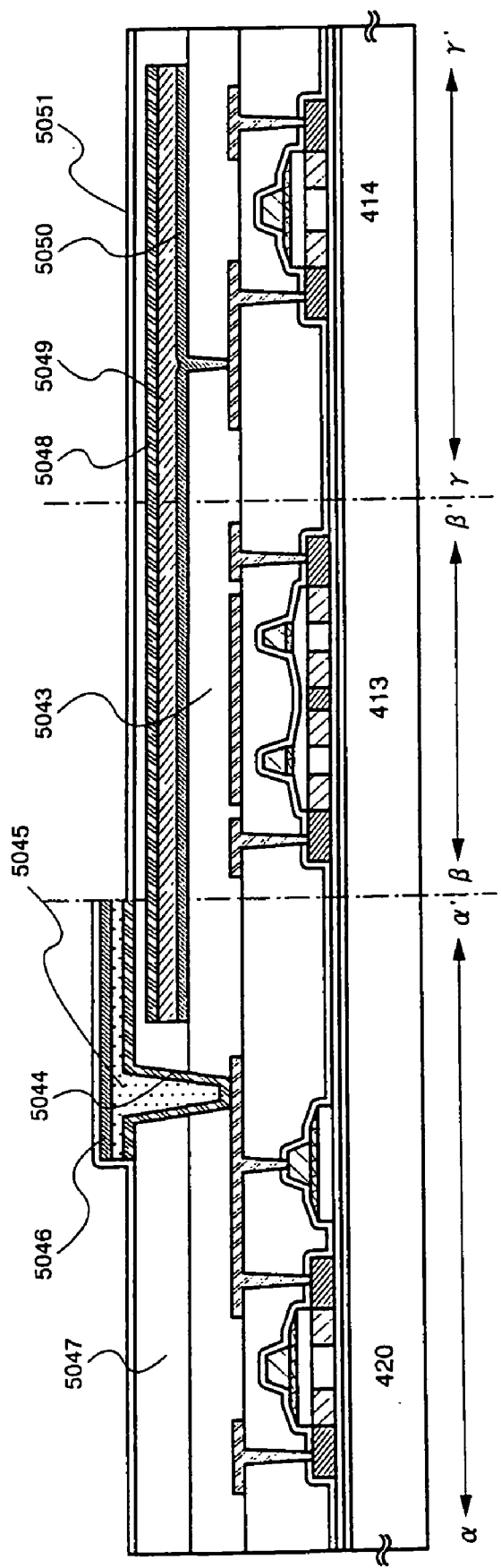
FIG. 17 is a diagram showing an example of a production process of an active matrix self light emitting device.
Figure 18:
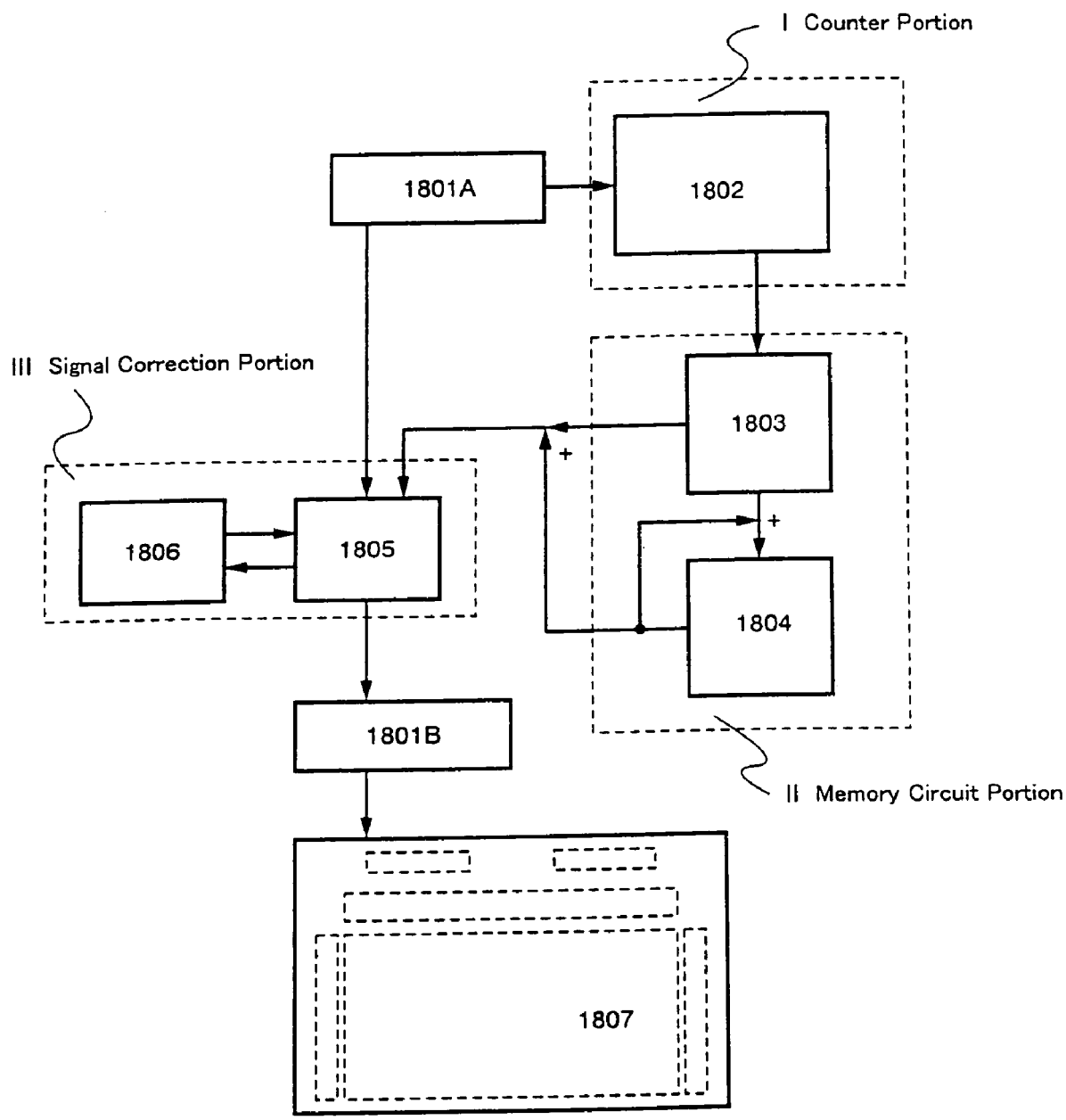
FIG. 18 is a block diagram of a self light emitting device having a correction function and recorded in Japanese Patent Application Serial No. 2000-273139.

However, in this case light is irradiated to the top surface, differing from the bottom surface irradiation (in which light emitted from the EL element is irradiated to the active matrix substrate side on which the TFTs are formed) explained up through this point. One example is shown in FIG. 17. A structure which is the opposite of the structure of embodiment 5 is thus used in order to conform to the direction light is emitted from the EL element, including a light receiving portion of the photoelectric element. In addition, the process order is set such that the EL layer is formed first, after forming the second interlayer insulating film 5043, and then the third interlayer insulating film 5047 is formed, after which the photoelectric conversion element is formed.

Embodiment 6

Figure 13:
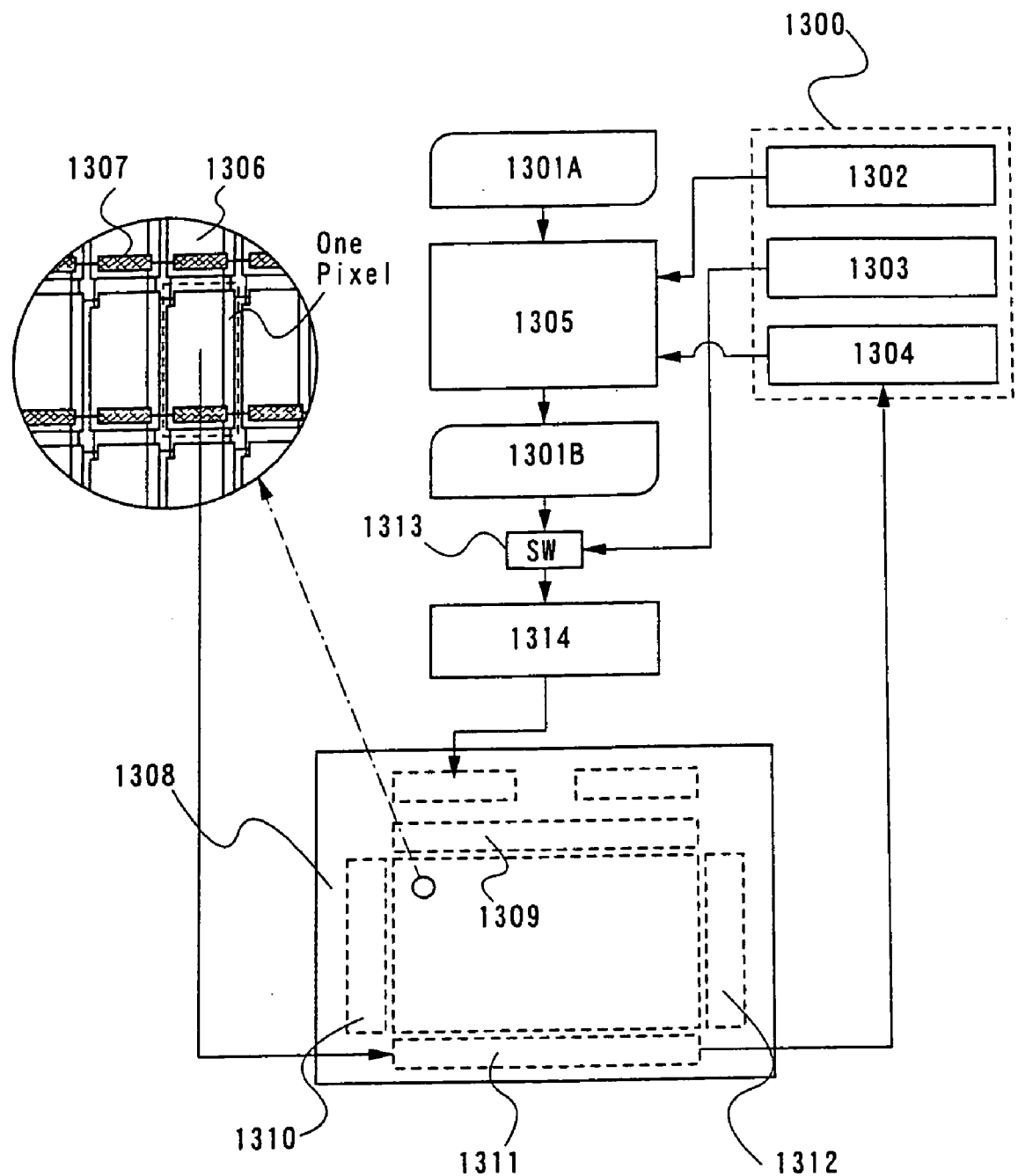
FIG. 13 is a block diagram of a self light emitting device of the present invention having brightness detection and correction functions.

Refer to FIG. 13. It is also possible to apply the self light emitting device of the present invention having a brightness correction function to a case in which a display device corresponds to an analog image signal. The second image signal (digital image signal) output from the correction circuit 1305 is converted to an analog image signal by a D/A conversion circuit 1314 in this case, is input to the display device 1308 corresponding to an analog image signal, and image display is performed.

Figure 14B:
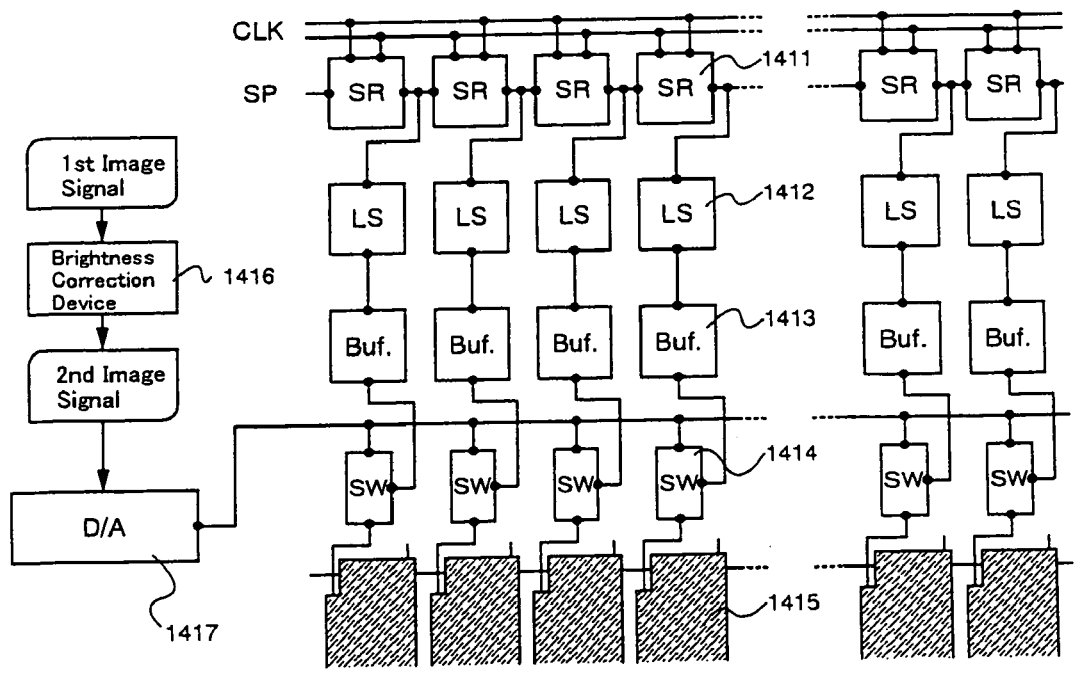
Figure 15A:
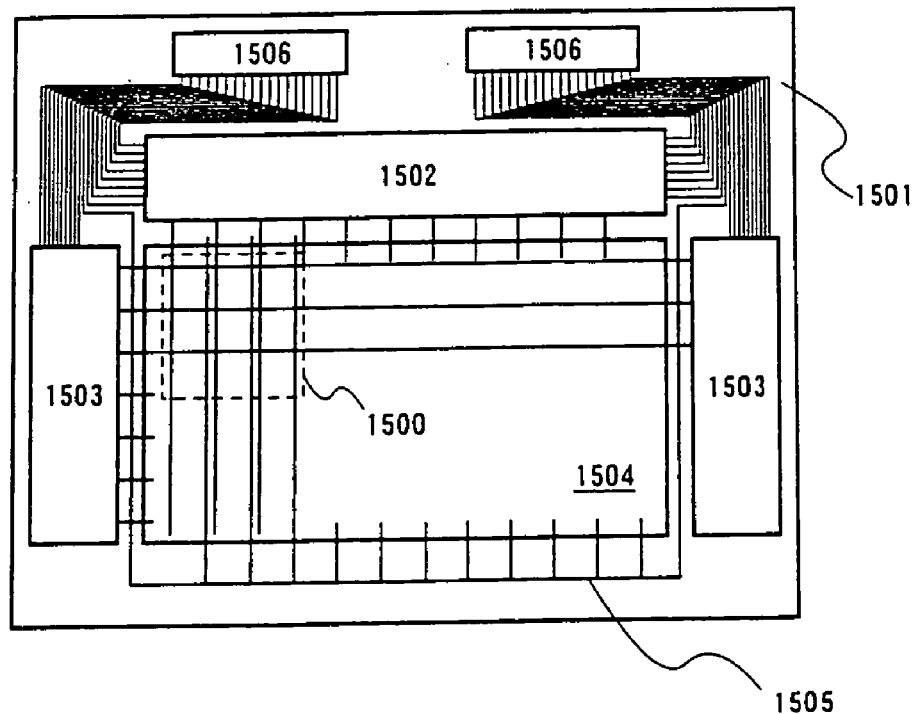
FIGS. 15A and 15B are diagrams showing an example of conventional self light emitting devices.
Figure 15B:
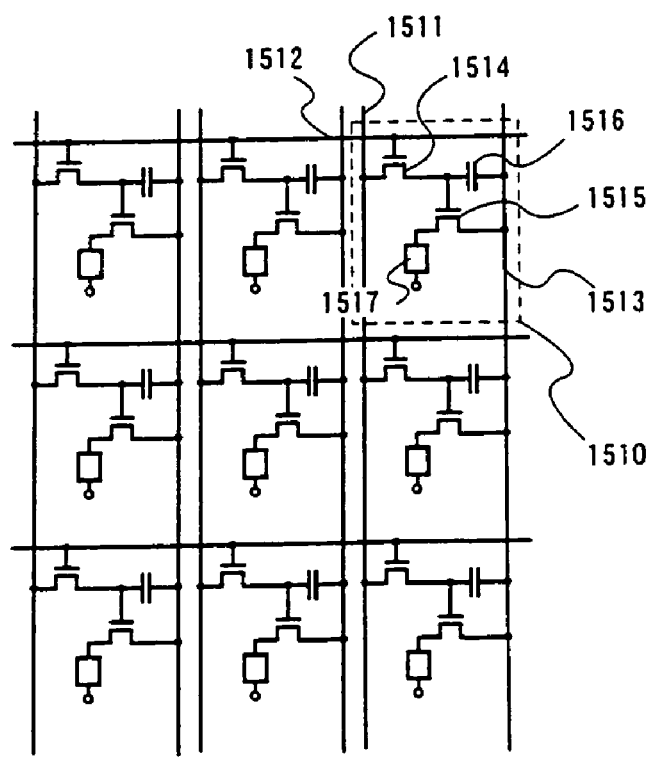

A circuit diagram of a source signal line driver circuit in the display device 1308 of FIG. 13 is shown in FIG. 14B. An example of a display device corresponding to an analog image signal is shown here. The source signal line driver circuit has circuits such as a shift register (SR) 1411, a level shifter 1412, a buffer 1413, and a sampling switch 1414. Reference numeral 1415 denotes a pixel, reference numeral 1416 denotes the brightness correction device shown in FIG. 13, and reference numeral 1417 denotes a D/A converter circuit.

Operation of each portion is explained. Sampling pulses are output one after another from the shift register in accordance with a clock signal (CLK) and a start pulse (SP). The voltage amplitude of the pulse is then increased by the level shifter, and the pulse is then output via the buffer. Correction is performed in the brightness correction device, and the digital image signal is converted to an analog image signal in the D/A converter circuit, and then input to a video signal line. The sampling switch is then opened in accordance with the timing of the sampling pulses, the analog image signal input to the video signal line is sampled, and display of an image is performed by writing voltage information into the pixels.

Note that, although the brightness correction device is formed on the outside of the display device in the example shown in FIG. 13, the two may also be formed as integrated on the same substrate, as discussed in embodiment 4.

Embodiment 7

In this embodiment, an external light emitting quantum efficiency can be remarkably improved by using an EL material by which phosphorescence from a triplet exciton can be employed for emitting a light. As a result, the power consumption of the EL element can be reduced, the lifetime of the EL element can be elongated and the weight of the EL element can be lightened.

The following is a report where the external light emitting quantum efficiency is improved by using the triplet exciton (T. Tsutsui, C. Adachi, S. Saito, Photochemical processes in Organized Molecular Systems, ed. K. Honda, (Elsevier Sci. Pub., Tokyo, 1991) p. 437).

The molecular formula of an EL material (coumarin pigment) reported by the above article is represented as follows.

(Chemical formula 1)

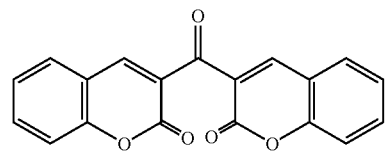

(M. A. Baldo, D. F. O'Brien, Y. You, A. Shoustikov, S. Sibley, M. E. Thompson, S. R. Forrest, Nature 395 (1998) p. 151)

The molecular formula of an EL material (Pt complex) reported by the above article is represented as follows.

(Chemical formula 2)

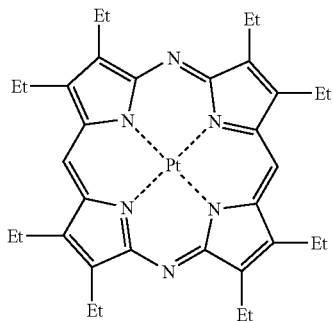

(M. A. Baldo, S. Lamansky, P. E. Burrows, M. E. Thompson, S. R. Forrest. Appl. Phys. Lett., 75 (1999) p. 4.)

(T. Tsutsui, M. -J.Yang, M. Yahiro, K. Nakamura. T. Watanabe, T. Tsuji, Y. Fukuda, T. Wakimoto, S. Mayaguchi, Jpn, Appl. Phys., 38 (12B) (1999) L1502)

The molecular formula of an EL material (Ir complex) reported by the above article is represented as follows.

(Chemical formula 3)

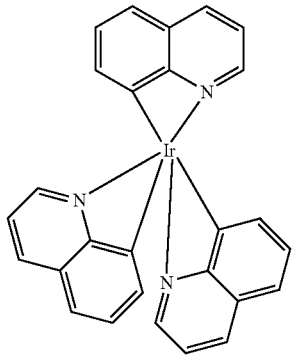

As described above, if phosphorescence from a triplet exciton can be put to practical use, it can realize the external light emitting quantum efficiency three to four times as high as that in the case of using fluorescence from a singlet exciton in principle. The structure according to this embodiment can be freely implemented in combination of any structures of the first to sixth embodiments.

Embodiment 8

The EL display which is applied to the light-emitting display device of the present invention, is a self-light emitting type, therefore compared to a liquid crystal display device, it has excellent visible properties and is broad in an angle of visibility. Accordingly, the light-emitting display device can be applied to a display portion in various electronic devices.

The display includes all kinds of displays to be used for displaying information, such as a display for a personal computer, a display for receiving a TV broadcasting program, a display for advertisement display. Moreover, the light-emitting device in accordance with the present invention can be used as a display portion of other various electric devices.

As other electronic equipments of the present invention there are: a video camera; a digital camera; a goggle type display (head mounted display); a car navigation system; an acoustic reproduction device (a car audio stereo, an audio component or the like); a notebook type personal computer; a game apparatus: a portable information terminal (a mobile computer, a portable telephone, a portable game machine, an electronic book or the like); and an image playback device equipped with a recording medium (specifically, device provided with a display portion which plays back images in a recording medium such as a digital versatile disk player (DVD), and displays the images). In particular, because portable information terminals are often viewed from a diagonal direction, the wideness of the field of vision is regarded as very important. Specific examples of those electronic equipments are shown in FIGS. 11 to 12.

Figure 11A:
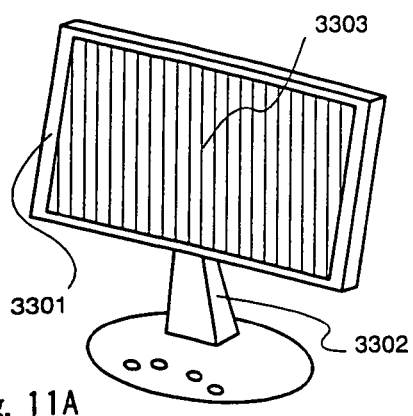
FIGS. 11A to 11F are diagrams showing examples of applications of the self light emitting device of the present invention having brightness detection and correction functions to electronic equipment.

FIG. 11A shows an EL display containing a casing 3301, a support stand 3302, and a display portion 3303. The light emitting device of the present invention can be used as the display portion 3303. Such an EL display is a self light emitting type so that a back light is not necessary. Thus, the display portion can be made thinner than that of a liquid crystal display.

Figure 11B:
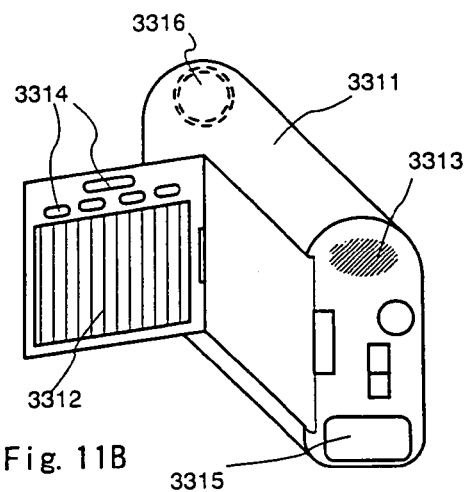

FIG. 11B shows a video camera, and contains a main body 3311, a display portion 3312, a sound input portion 3313, operation switches 3314, a battery 3315, and an image receiving portion 3316. The light emitting device of the present invention can be used as the display portion 3312.

Figure 11C:
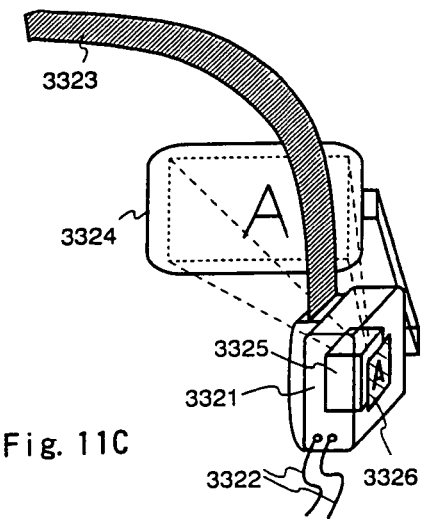

FIG. 11C shows one portion (i.e., a right-hand side) of a head-mounted EL display including a body 3321, a signal cable 3322, a head fixing band 3323, a display unit 3324, an optical system 3325 and a display portion 3326. The light emitting device of the present invention can be used as the display portion 3326.

Figure 11D:
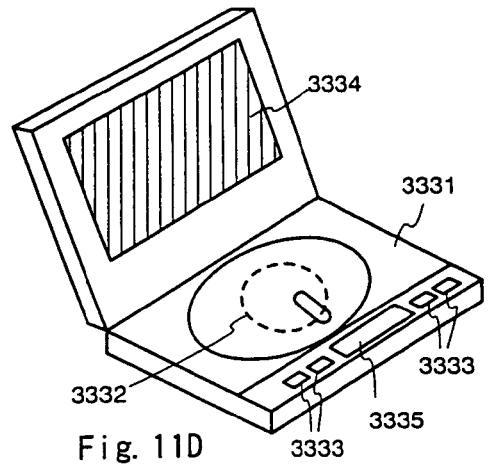

FIG. 11D is an image playback device equipped with a recording medium (specifically, a DVD playback device), and contains a main body 3331, a recording medium (such as a DVD) 3332, operation switches 3333, a display portion (a) 3334, and a display portion (b) 3335. The display portion (a) 3334 is mainly used for displaying image information. The display portion (b) 3335 is mainly used for displaying character information. The light emitting device of the present invention can be used as the display portion (a) 3334 and as the display portion (b) 3335. Note that the image playback device equipped with the recording medium includes game machines or the like.

Figure 11E:
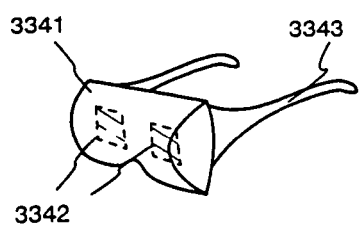

FIG. 11E is a goggle type display (head mounted display), and contains a main body 3341, a display portion 3342 and arm portion 3343. The light emitting device of the present invention can be used as the display portion 3342.

Figure 11F:
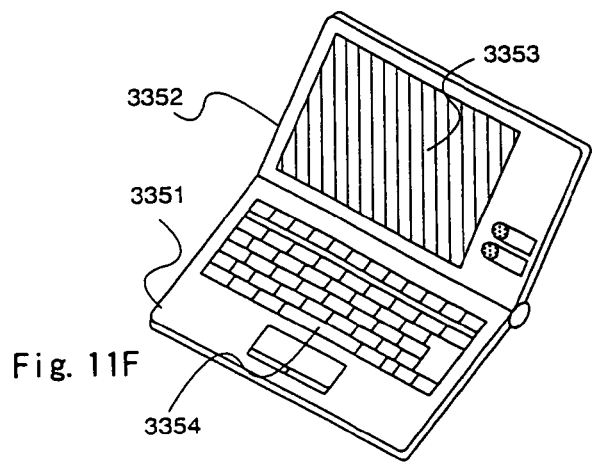

FIG. 11F is a personal computer, and contains a main body 3351, a casing 3352, a display portion 3353, and a keyboard 3354. The light emitting device of the present invention can be used as the display portion 3353.

Note that if the luminance of EL material increases in the future, then it will become possible to use the light emitting device of the present invention in a front type or a rear type projector by expanding and projecting light containing output image information with a lens or the like.

Further, the above electric devices display often information transmitted through an electronic communication circuit such as the Internet and CATV (cable TV), and particularly situations of displaying moving images is increasing.

The response speed of EL materials is so high that the above electric devices are good for display of moving image.

In addition, since the EL display conserves power in the light emitting portion, it is preferable to display information so as to make the light emitting portion as small as possible. Consequently, when using the EL display in a display portion mainly for character information, such as in a portable information terminal, in particular a portable telephone or a sound reproduction device, it is preferable to drive the light emitting device so as to form character information by the light emitting portions while non-light emitting portions are set as background.

FIG. 12A shows a portable telephone, and contains a main body 3401, a sound output portion 3402, a sound input portion 3403, a display portion 3404, operation switches 3405, and an antenna 3406. The light emitting device of the present invention can be used as the display portion 3404. Note that by displaying white color characters in a black color background, the display portion 3404 can suppress the power consumption of the portable telephone.

FIG. 12B shows an acoustic reproduction device as exemplified by a car audio stereo, and contains a main body 3411, a display portion 3412, and operation switches 3413 and 3414. The light emitting device of the present invention can be used as the display portion 3412. Further, a car mounting audio stereo is shown in this embodiment, but a portable audio playback device or a fixed type audio playback device may also be used. Note that, by displaying white color characters in a black color background, the display portion 3414 can suppress the power consumption. This is particularly effective in suppressing the power consumption of the portable acoustic reproduction device.

FIG. 12C shows a digital camera, and contains a main body 3501, a display portion A 3502, an eye piece portion 3503, and operation switches 3504, display portion B 3505 and battery 3506. The light emitting device of the present invention can be used as the display portion A 3502 and the display portion B 3505.

As described above, the application range of this invention is extremely wide, and it may be used for electric devices in various fields. Further, the electric device of this embodiment may be obtained by using a light emitting device freely combining the structures of the first to seventh embodiments.

Brightness insufficiencies due to degradation of EL elements, or due to other causes, are corrected on the circuit side by a self light emitting device of the present invention, and a self light emitting device capable of uniform display on a screen, with no brightness irregularities, can be provided.

What is claimed is:

1. A light emitting device comprising:
   means for detecting brightnesses of light emitting elements of pixels;
   means for storing the brightnesses; and
   means for correcting an image signal based on the stored brightnesses,
   wherein an image is displayed using the corrected image signal, and
   wherein the correction means performs relative subtraction processing on image signals written into pixels which develop a small reduction in brightness with respect to image signals written into pixels which develop a large reduction in brightness.

2. The light emitting device according to claim 1, wherein the storage means comprises a static memory circuit.

3. The light emitting device according to claim 1, wherein the storage means comprises a dynamic memory circuit.

4. The light emitting device according to claim 1, wherein the storage means comprises a ferroelectric memory circuit.

5. The light emitting device according to claim 1, wherein the storage means comprises a non-volatile memory capable of being electrically written into, read out from, and erased.

6. A light emitting device comprising:
   means for detecting brightnesses of light emitting elements of pixels;
   means for storing the brightnesses; and
   means for correcting an image signal based on the stored brightnesses,
   wherein an image is displayed using the corrected image signal, and
   wherein the correction means performs relative subtraction processing on image signals written into pixels which do not develop a reduction in brightness with respect to image signals written into pixels which develop a large reduction in brightness.

7. The light emitting device according to claim 6, wherein the storage means comprises a static memory circuit.

8. The light emitting device according to claim 6, wherein the storage means comprises a dynamic memory circuit.

9. The light emitting device according to claim 6, wherein the storage means comprises a ferroelectric memory circuit.

10. The light emitting device according to claim 6, wherein the storage means comprises a non-volatile memory capable of being electrically written into, read out from, and erased.

11. A portable phone comprising:
    a main body;
    a sound input portion;
    a sound output portion;
    a display portion; and
    operation switches,
    wherein the display portion comprises a light emitting device, the light emitting device comprises:
    means for detecting brightnesses of light emitting elements of pixels,
    means for storing the brightnesses, and
    means for correcting an image signal based on the stored brightnesses,
    wherein an image is displayed using the corrected image signal, and
    wherein the correction means performs relative subtraction processing on image signals written into pixels which develop a small reduction in brightness with respect to image signals written into pixels which develop a large reduction in brightness.

12. The portable phone according to claim 11, wherein the storage means comprises a static memory circuit.

13. The portable phone according to claim 11, wherein the storage means comprises a dynamic memory circuit.

14. The portable phone according to claim 11, wherein the storage means comprises a ferroelectric memory circuit.

15. The portable phone according to claim 11, wherein the storage means comprises a non-volatile memory capable of being electrically written into, read out from, and erased.

16. A portable phone comprising:
    a main body;
    a sound input portion;
    a sound output portion;
    a display portion; and
    operation switches,
    wherein the display portion comprises a light emitting device, the light emitting device comprises:

means for detecting brightnesses of light emitting elements of pixels,
means for storing the brightnesses, and
means for correcting an image signal based on the stored brightnesses,
wherein an image is displayed using the corrected image signal, and
wherein the correction means performs relative subtraction processing on image signals written into pixels which do not develop a reduction in brightness with respect to image signals written into pixels which develop a large reduction in brightness.

17. The portable phone according to claim 16, wherein the storage means comprises a static memory circuit.

18. The portable phone according to claim 16, wherein the storage means comprises a dynamic memory circuit.

19. The portable phone according to claim 16, wherein the storage means comprises a ferroelectric memory circuit.

20. The portable phone according to claim 16, wherein the storage means comprises a non-volatile memory capable of being electrically written into, read out from, and erased.

* * * * *